(12) United States Patent
Sugita et al.

(10) Patent No.: US 8,758,903 B2
(45) Date of Patent: Jun. 24, 2014

(54) ORGANIC ELECTROLUMINESCENT ELEMENT, DISPLAY DEVICE AND LIGHTING DEVICE

(75) Inventors: Shuichi Sugita, Tokyo (JP); Hiroshi Kita, Tokyo (JP)

(73) Assignee: Konica Minolta Holdings, Inc. (JP)

( * ) Notice: Subject to any disclaimer, the term of this patent is extended or adjusted under 35 U.S.C. 154(b) by 1549 days.

(21) Appl. No.: 12/091,652

(22) PCT Filed: Sep. 29, 2006

(86) PCT No.: PCT/JP2006/319441
§ 371 (c)(1),
(2), (4) Date: Apr. 25, 2008

(87) PCT Pub. No.: WO2007/052431
PCT Pub. Date: May 10, 2007

(65) Prior Publication Data
US 2009/0239000 A1    Sep. 24, 2009

(30) Foreign Application Priority Data

Oct. 31, 2005   (JP) ................................ 2005-315972

(51) Int. Cl.
*H01L 51/54* (2006.01)
(52) U.S. Cl.
USPC ..... 428/690; 428/917; 313/504; 257/E51.044
(58) Field of Classification Search
None
See application file for complete search history.

(56) References Cited

U.S. PATENT DOCUMENTS

| | | | |
|---|---|---|---|
| 6,687,266 B1 | 2/2004 | Ma et al. | |
| 2001/0019782 A1* | 9/2001 | Igarashi et al. | 428/690 |
| 2005/0016462 A1* | 1/2005 | Yamazaki | 118/726 |
| 2006/0024522 A1* | 2/2006 | Thompson | 428/690 |
| 2006/0088951 A1* | 4/2006 | Hayashi et al. | 438/99 |
| 2006/0145145 A1* | 7/2006 | Nishio | 257/40 |
| 2006/0251923 A1* | 11/2006 | Lin et al. | 428/690 |
| 2009/0045728 A1* | 2/2009 | Murano et al. | 313/504 |

FOREIGN PATENT DOCUMENTS

| | | |
|---|---|---|
| JP | 2001-247859 A | 9/2001 |
| JP | 2002-100476 A | 4/2002 |
| JP | 2002-117978 A | 4/2002 |
| JP | 2002-299061 A | 10/2002 |
| JP | 2006-120762 A | 5/2006 |
| JP | 2006-120905 A | 5/2006 |
| JP | 2006-237306 A | 5/2006 |
| JP | 2006-193546 A | 7/2006 |
| WO | 2004/085450 | 10/2004 |
| WO | 2004/101707 A1 | 11/2004 |
| WO | 2005-123873 A1 | 12/2005 |
| WO | 2006-098209 A1 | 9/2006 |
| WO | 2006-126389 A1 | 11/2006 |

OTHER PUBLICATIONS

International Search Report for International Application No. PCT/JP2006/319441 mailed Dec. 19, 2006.
European Search Report for Application No. 06810847.1-1235/1953843 with English translation mailed Apr. 7, 2010.
Baranoff, Etienne, et al. "Cyclometalated Iridium (III) Complexes Based on Phenyl-Imidazole Ligand", Inorganic Chemistry, 2011, 50, pp. 451-462.
Paul J. Low et al. "Towards an understanding of structure-property relationships in hole-transport materials: The influence of molecular conformation on oxidation potential in poly(aryl) amines." J. Mater. Chem. 2005, 15, 2304-2315.
Tamayo et al., "Synthesis and Characterization of Facial and Meridional Tris-cyclometalated Iridium (III) Complexes", J. Am. Chem. Soc., 2003, 125, pp. 7377-7387.

* cited by examiner

*Primary Examiner* — Marie R. Yaminitzky
(74) *Attorney, Agent, or Firm* — Cantor Colburn LLP

(57) ABSTRACT

An organic electroluminescent device having high luminance and long-term stability under high temperature, high humidity conditions. This organic electroluminescent device is suppressed in voltage increase and generation of dark spots when driven at a constant current. Additionally, a display and an illuminating device can be made using the organic electroluminescent device. The organic electroluminescent device is characterized in that at least one of organic layers constituting the device is a light-emitting layer containing a host compound and a phosphorescent compound of the general formula:

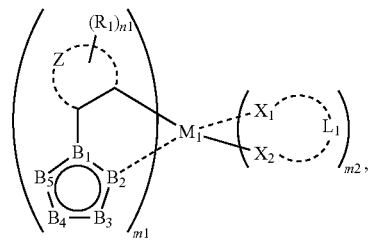

and the at least one organic layer has a film surface density of 1.10-1.25 g/cm$^3$.

11 Claims, 3 Drawing Sheets

ORGANIC ELECTROLUMINESCENT ELEMENT, DISPLAY DEVICE AND LIGHTING DEVICE

CROSS REFERENCE TO RELATED APPLICATIONS

This is a U.S. national stage of application No. PCT/JP2006/319441, filed on Sep. 29,2006. Priority under 35 U.S.C. §119(a) and 35 U.S.C. §365(b) is claimed from Japanese Application No. 2005-315972, filed Oct. 31,2005, the disclosure of which is also incorporated herein by reference.

TECHNICAL FIELD

The present invention relates to an organic electroluminescent element, a display device and a lighting device.

BACKGROUND

Conventionally, an emission type electronic display device includes an electroluminescence display (hereinafter, referred to as an ELD). A constituent element of ELD includes such as an inorganic electroluminescent element and an organic electroluminescent element (hereinafter, referred to as an organic EL element).

An organic electroluminescent element is an element provided with a constitution comprising an emission layer containing a emitting substance being sandwiched with a cathode and an anode, and an exciton is generated by an electron and a positive hole being injected into the emission layer to be recombined, resulting emission utilizing light release (fluorescence-phosphorescence) at the time of deactivation of said exciton; the emission is possible at a voltage of approximately a few to a few tens volts, and an organic electroluminescent element is attracting attention with respect to such as superior viewing angle and high visual recognition due to a self-emission type as well as space saving and portability due to a completely solid element of a thin layer type.

In recent years, an organic EL element which utilizes phosphorescence from an excited triplet has been reported from Princeton University (refer to Non patent document 1), researches on materials exhibiting phosphorescence at room temperature have come to be active (refer to Non patent document 2.) Since the upper limit of internal quantum efficiency becomes 100% by utilization of an excited triplet, which is principally 4 times of the case of an excited singlet, it may be possible to achieve almost the same ability as a cooled cathode ray tube to attract attention also for an illumination application. For example, in such as, many compounds mainly belonging to heavy metal complexes such as iridium complexes have been synthesized and studied (refer to Non patent document 3 and Patent document 1.)

Currently, an increase in light emission efficiency and an extension of operating life of organic EL elements, utilizing phosphorescent emission, have been investigated (refer, for example, to Patent Documents 2 and 3). With regard to green light emission, its external light emission efficiency has reached approximately 20% which is the theoretical maximum. On the other hand, light emission of the other colors has not resulted in sufficient efficiency and their improved efficiency has been sought. Specifically, an element which results in a high efficiency of blue light emission has been sought.

On the other hand, of organic light emitting elements, an element, which achieves light emission of high luminance, is one which is constituted by lamination of organic materials produced via vacuum deposition. In view of simplification of production processes, workability, and a larger area, element preparation based on coating systems is hereby disclosed (refer to Patent Document 4).

However, conventional organic electroluminescent elements have further been required to minimize voltage rise when driven at a low voltage and formation of dark spots, and to improve storage stability at high temperature and high humidity.

Patent Document 1: International Patent Publication Open to Public Inspection No. 04/085450 Pamphlet
Patent Document 2: Japanese Patent Publication Open to Public Inspection (hereinafter referred to as JP-A) No. 2002-100476
Patent Document 3: JP-A No. 2002-117978
Patent Document 4: JP-A No. 2002-299061
Non-Patent Document 1: M. A. Baldo et al., Nature, Volume 395, pages 151-154 (1998)
Non-Patent Document 2: M. A. Baldo et al., Nature, Volume 403, No. 17, pages 750-753 (2000)
Non-Patent Document 3: S. Lamansky et al., J. Am. Chem. Soc., Volume 123, page 4,304 (2001).

DISCLOSURE OF THE INVENTION

Problems to be Solved by the Invention

In view of the foregoing problems, the present invention was achieved. An object of the present invention is to provide an organic electroluminescent element which results in high luminance of emitted light, minimizes voltage rise while driven at a constant electric current, prevents formation of dark spots, and further exhibits high storage stability at high temperature and high humidity, as well as a display device and a lighting device employing the same.

Means to Solve the Problems

The above problems of the present invention were solved by the following embodiments.

1. In an organic electroluminescent element which incorporates a substrate having thereon an electrode and at least one organic layer, an organic electroluminescent element wherein at least one of the aforesaid organic layers is a light emitting layer which incorporates the phosphorescent compound represented by Formula (1) and a host compound, and the film surface density of at least one of the aforesaid organic layers is 1.10-1.25 $g/cm^3$.

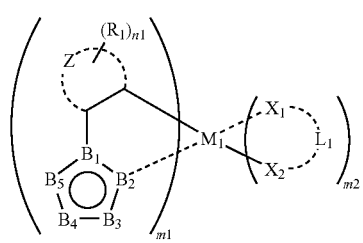

Formula (1)

In the above formula, $R_1$ represents a substituent; Z represents a group of non-metallic atoms necessary to form a 5- to 7-membered ring; n1 represents an integer of 0-5; $B_1$-$B_5$ each represents a carbon atom, a nitrogen atom, an oxygen atom, or a sulfur atom, provided that at least one of $B_1$-$B_5$ represents a nitrogen atom; $M_1$ represents a metal in Groups 8-10 of a periodic table; $X_1$ and $X_2$ each represents a carbon atom, a nitrogen atom, or an oxygen atom; L1 represents a group of atoms which form a bidentate together with $X_1$ and $X_2$; m1 represents an integer of 1-3; and m2 represents an integer of 0-2, provided that a sum of m1 and m2 is an integer of 2 or 3.

2. The organic electroluminescent element, described in 1., wherein the film surface density of at least one of the aforesaid organic layers is 1.20-1.25 $g/cm^3$.
3. The organic electroluminescent element, described in 1. or 2., wherein the molecular weight of the aforesaid host compound is 400-2,000.
4. The organic electroluminescent element, described in 1., wherein the film surface density of at least one of the aforesaid organic layers is 1.10-1.15 $g/cm^3$.
5. The organic electroluminescent element, described in 1. or 2., wherein the molecular weight of the aforesaid host compound is 5,000-1,000,000.
6. The organic electroluminescent element, described in any one of 1.-5., wherein the aforesaid organic layer incorporates an organic solvent in an amount of $10^{-2}$-$10^3$ ppm.
7. The organic electroluminescent element, described in any one of 1.-6., wherein the aforesaid substrate incorporates a gas barrier layer.
8. The organic electroluminescent element, described in any one of 1.-7., wherein blue light is emitted.
9. The organic electroluminescent element, described in any one of 1.-7., wherein white light is emitted.
10. A display device incorporating the electroluminescent element described in any one of 1-9.
11. A lighting device incorporating the electroluminescent element described in any one of 1-9.
12. A display device incorporating the lighting device described in 11 and a liquid crystal element as a display means.

EFFECTS OF THE INVENTION

The present invention can provide an organic electroluminescent element which results in high luminance of emitted light, minimizes voltage rise while driven at a constant voltage, prevents formation of dark spots, and further exhibits high storage stability at high temperature and high humidity, as well as a display device and a lighting device employing the same.

Figure 1:
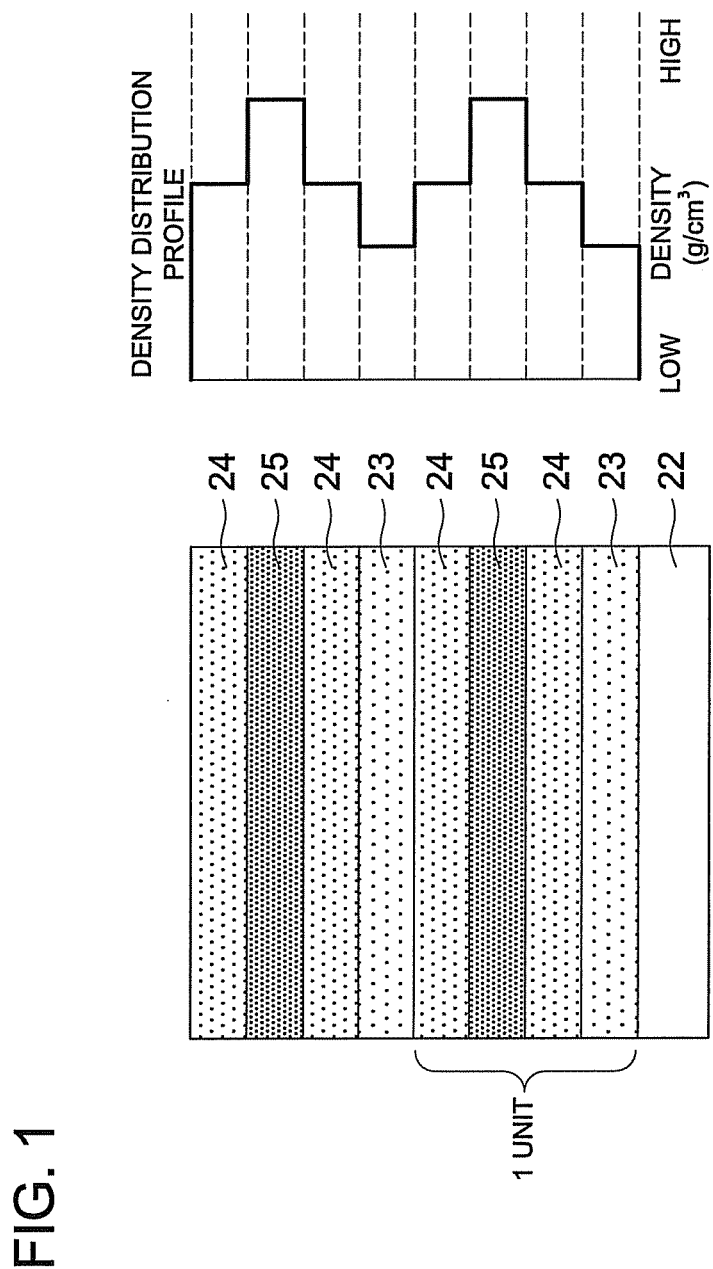
FIG. 1 is a schematic view showing one example of the layer configuration and its density profile of the transparent gas barrier film according to the present invention.

DESCRIPTION OF THE ALPHA-NUMERIC DESIGNATIONS 1 display
3 pixel
5 scanning line
6 data line
10 ink-jet system head
22 substrate
23 closely adhered film
24 ceramic film
25 protective film
30 plasma discharge treatment chamber
35 roller electrode
36 electrode
41 and 42 power sources
51 gas feeding apparatus
55 electrode cooling unit
100 ITO substrate
111 positive hole transporting layer
112 light emitting layer
113 electron transporting layer
114 cathode
115 gas barrier layer
A display section
B control section
D liquid droplet

PREFERRED EMBODIMENTS TO CARRY OUT THE INVENTION

The above problems of the present invention were solved via the following embodiments.

It was discovered that in an organic EL element which incorporated a substrate having thereon an electrode and at least one organic layer, it was possible to prepare an organic EL element which resulted in high luminance of the emitted light, minimized voltage rise when driven at a constant voltage, prevented formation of dark spots, and exhibited high storage stability at high temperature and high humidity, in such a manner that at least one of the aforesaid organic layers is a light emitting layer incorporating the dopant represented by above Formula (1), and the film surface density of at least one of the aforesaid organic layers was regulated to be 1.10-1.25 $g/cm^2$.

Each of the constituting elements of the present invention will now be detailed.

The measurement method of the film surface density employed in the present invention will be described.

It is possible to determine the film surface density employing an X-ray reflectance ratio measurement method. Reflectance ratios at extremely low angles such as a range of 0.2°-2° are determined. The resulting reflectance ratio curve is fitted to the reflectance ratio formula of a multilayered sample obtained by the Fresnel formula, whereby the film surface density is obtained. The fitting method may be referred to L. G. Parrat, Phys. Rev., 95 365 (1954).

In practice, an X-ray generator is operated at 50 kV-300 mA while employing copper as a target. A monochromic X-ray produced via a multilayered mirror and a Ge(111) channel cut monochrometer is employed. During measurement, software ATX-Crystal Guide Ver. 6.5.3.4 is employed, and after halving and alignment adjustment, scanning is carried out at 0.05°/minute while $2\theta/\omega$=0-1° is set at 0.002°/step. After determining a reflectance ratio curve under the above measurement conditions, it is possible to carry out measurement employing GXRR Ver. 2.1.0.0 analytical software, produced by Rigaku Corp.

The film density of at least one of the organic layers according to the present invention is preferably 1.10-1.25 g/cm. By doing so, further improved effects are realized to minimize the voltage rise when driven at constant electric current, prevent formation of dark spots and result in high storage stability at high temperature and high humidity.

A method to determine the content of organic solvents employed in the present invention will now be described.

It is possible to determine the residual amount of organic solvents in the organic layer according to the present invention by employing a gas chromatographic mass spectroscopy method (PT-GC/MS) fitted with a purge and a trap sampler. In practice, a 10 cm×10 cm square organic EL element is prepared, and residual organic solvents are adsorbed into a gas recovering chamber and an organic gas adsorbing tube (TENAX GR), followed by value determination. Solvent concentration is determined via a calibration curve which is prepared employing standards samples, the concentration each of which is known.

The organic layer according to the present invention incorporates organic solvents preferably in an amount of $10^{-2}$-$10^3$ ppm, but more preferably in an amount of 0.1-100 ppm, whereby any voltage rise when driven at constant electric current and formation of dark spots are effectively minimized, and further storage stability at high temperature and high humidity is improved.

Organic solvents according to the present invention are not particularly limited, and examples thereof include alcohols (methanol or ethanol), carboxylic acid esters (ethyl acetate or propyl acetate), nitrites (acetonitrile), ethers (isopropyl ether or THF), aromatic hydrocarbons (cyclohexylbenzene, toluene, or xylene), halogenated alkyls (methylene chloride), and saturated hydrocarbons (such as heptane). Of these, preferred are the carboxylic acid esters, the nitrites, the ethers, the aromatic hydrocarbons, the halogenated alkyls, and the saturated hydrocarbons, and of these, more preferred are the carboxylic acid esters, the ethers, and the aromatic hydrocarbons.

The boiling point of the organic solvents employed in the present invention is preferably at most 200° C., but is more preferably at most 150° C.

The organic layer according to the present invention is formed via any of the common coating methods such as a spin coating, dip coating, roller coating, flexographic printing, screen printing, offset printing, or ink-jet method. Of these preferred is the ink-jet method.

The phosphorescing compounds represented by Formula (1) of the present invention will now be described.

Examples of the substituents represented by $R_1$ include an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); a cycloalkyl group (for example, a cyclopentyl group, and a cyclohexyl group); an alkenyl group (for example, a vinyl group and an allyl group); an alkynyl group (for example, an ethynyl group and a propagyl group); an aromatic hydrocarbon ring group (also called an aromatic carbon ring or an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenantolyl group, an indenyl group, a pyrenyl group, and a biphenyryl group); an aromatic heterocyclyl group (for example, a pyridyl group, a pyrimidinyl group, a furyl group, a pyrrolyl group, an imidazolyl group, a benzimidazolyl group, a pyrazolyl group, a pyrazinyl group, a triazolyl group (for example, a 1,2,4-triazole-1-yl group, and a 1,2,3-triazole-1-yl group); an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolynyl group; a diazacarbazolyl group (which is a group in which one of the carbon atoms constituting the carboline ring of the above carbolynyl group is replaced with a nitrogen atom), a quinoxanilyl group, a pyridadinyl group, a triazinyl group, a quinazolinyl group, and phthalazine group); a heterocyclyl group (for example, a pyrrolidyl group, an imidazolidyl group, a morpholyl group, and an oxazilidyl group); an alkoxy group (for example, a methoxy group, an ethoxy group, a propyloxy group, a pentyloxy group, an hexyloxy group, an octyloxy group, and a dodecyloxy group); a cycloalkoxy group (for example, a cyclopentyloxy group and a cyclohexyloxy group); an aryloxy group (for example, a phenoxy group and a naphthyloxy group); an alkylthio group (for example, a methylthio group, an ethylthio group, a propylthio group, a pentylthio group, a hexylthio group, an octylthio group, and a dodecylthio group); a cycloalkylthio group (for example, a cyclopentylthio group and a cyclohexylthio group); an arylthio group (for example, a phenylthio group and a naphthylthio group); an alkoxycarbonyl group (for example, a methyloxycarbonyl group, an ethyloxycarbonyl group, a butyloxycarbonyl group, an octyloxycarbonyl group, and a dodecyloxycarbonyl group); an aryloxycarbonyl group (for example, a phenyloxycarbonyl group and a naphthyloxycarbonyl group); a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group); an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group); an acyloxy group (for example, an acetyloxy group, an ethylcarbonyloxy group, a butylcarbonyloxy group, an octylcarbonyloxy group, a dodecylcarbonyloxy group, and a phenylcarbonyloxy group); an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group); a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group); a ureido group (for example, a methylureido group, an ethylureido group, a pentylureido group, a cyclohexylureido group, an octylureido group, a dodecylureido group, a phenylureido group, a naphthylureido group, and a 2-oyridylaminoureido group); a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group); an alkylsulfonyl group (for example, a methylsulfonyl group, an ethylsulfonyl group, a butylsulfinyl group, a cyclohexylsulfonyl group, a 2-ethylhexylsulfonyl group, and a dodecylsulfonyl group, an arylsulfonyl group or a heteroarylsulfonyl group (for example, a phenylsulfonyl group, a naphthylsulfonyl group, and a 2-pyridylsulfonyl group); an amino group (for example, an amino group, an ethylamino group, a dimethylamino group, a butylamino group, a cyclopentylamino group, a dodecylamino group, an anilino group, a naphthylamino group, and a 2-pyridylamino group); a cyano group; a nitro group; a hydroxyl group; a mercapto group; a silyl group (for example, a trimethylsilyl group, a triisopropylsilyl group, a triphenylsilyl group, and a phenyldiethylsilyl group).

Of these substituents preferred are the alkyl or aryl groups and more preferred are the unsubstituted alkyl or aryl groups.

Z represents a group of atoms which are necessary to form a 5- to 7-membered ring. Examples of the 5- to 7-membered rings include a benzene ring, a naphthalene ring, a pyridine ring, a pyrimidine ring, a pyrrole ring, a thiophene ring, a pyrazole ring, an imidazole ring, an oxazole ring, and a thiazole ring, and of these preferred is the benzene ring.

$B_1$-$B_5$ each represents a nitrogen atom, an oxygen atom, or a sulfur atom, and at least one of them represents a nitrogen atom. The aromatic nitrogen-containing heterocyclic ring which is formed via the above 5 atoms is preferably a single ring. Examples thereof include a pyrrole ring, a pyrazole ring, an imidazole ring, a triazole ring, a tetrazole ring, an oxazole ring, an isooxazole ring, a thiazole ring, an isothiazole ring, an oxadiazole ring, and a thiadiazole ring. Of these preferred are the pyrazole ring and the imidazole ring, and more preferred is the imidazole ring.

$L_1$ represents a group of atoms which form a bidentate ligand together with $X_1$ and $X_2$. Specific examples of the bidentate ligands represented by $X_1$-$L_1$-$X_2$ include substituted or unsubstituted phenylpyridine, phenylpyrazole, phenylimidazole, phenyltriazole, phenyltetrazole, pyrazabole, picolinic acid, and acetylacetone.

These substituents may further be substituted with the above substituents.

"m1" represents an integer of 1-3, and m2 represents an integer of 0-2, while the sum of m1 and m2 is 2 or 3. Of these, m2 is preferably 0.

The employed metals represented by $M_1$ include transition metals in Groups 8-10 in the element periodic table (hereinafter also referred simply to as transition metals), and of these preferred are iridium and platinum.

The phosphorescent compounds represented by Formula (1) of the present invention may have neither a polymerizable group nor a reactive group.

Specific examples of the phosphorescent compounds represented by Formula (1) of the present invention will now be listed, however the present invention is not limited thereto.

1-1

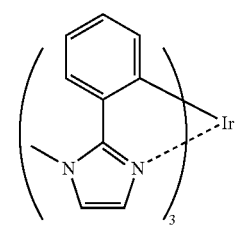

1-2

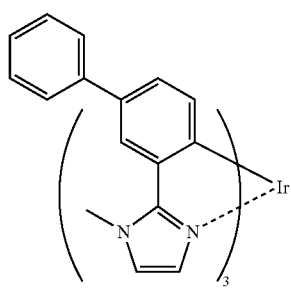

1-3

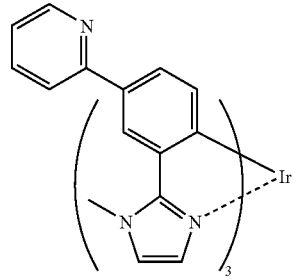

1-4

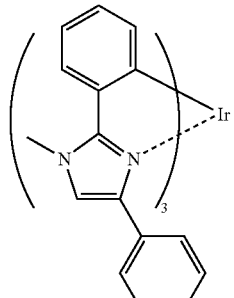

1-5

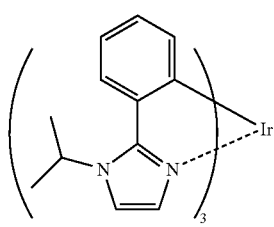

1-6

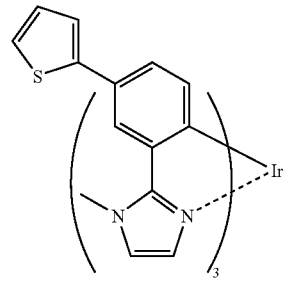

1-7

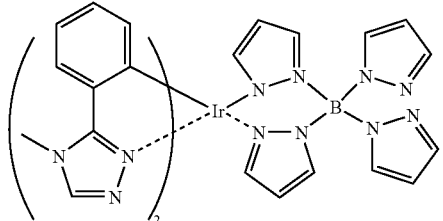

1-8

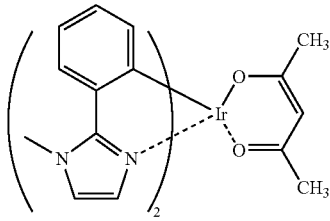

1-9
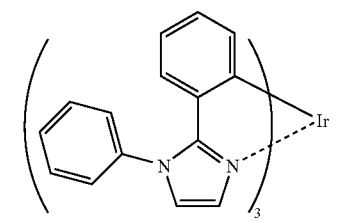
1-10
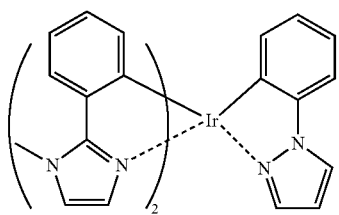
1-11
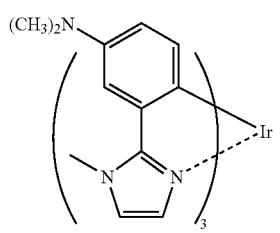
1-12
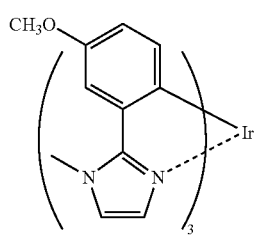
1-13
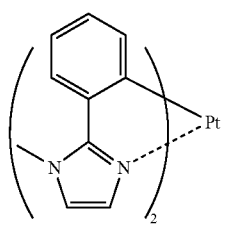
1-14
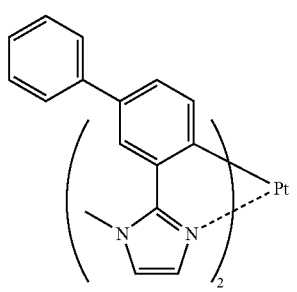
1-15
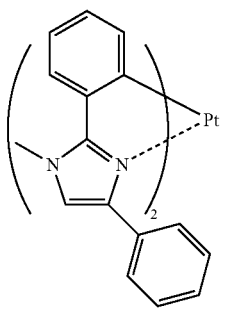
1-16
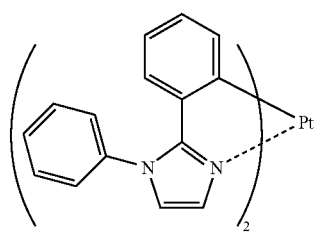
1-17
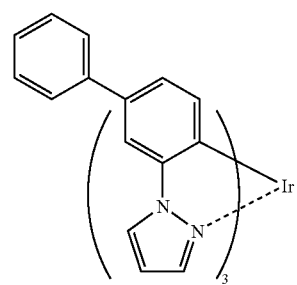
1-18
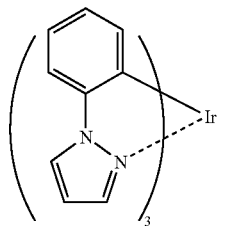
1-19
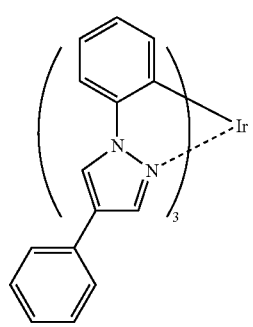

-continued
1-20
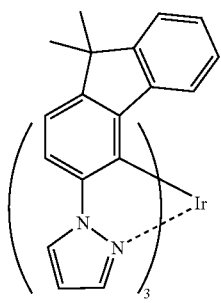
1-21
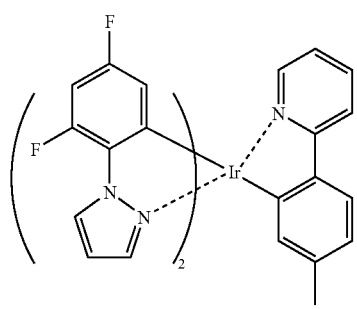
1-22
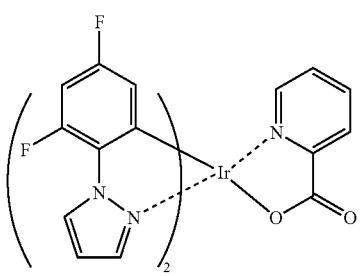
1-23
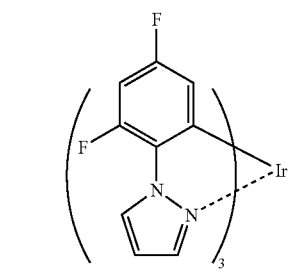
1-24
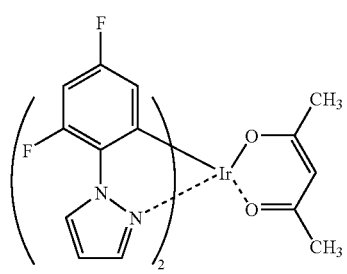
-continued
1-25
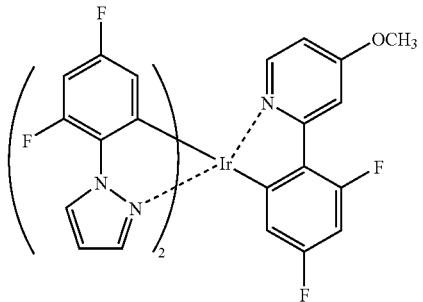
1-26
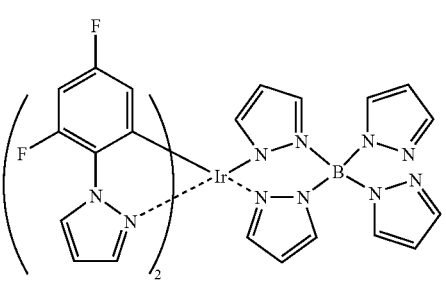
1-27
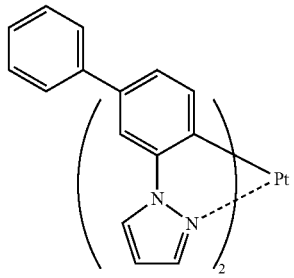
1-28
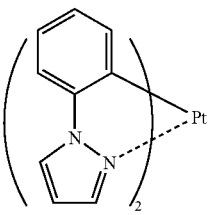
1-29
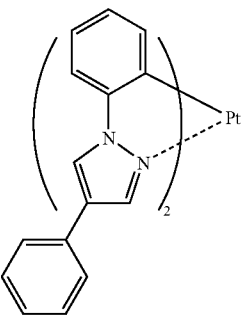

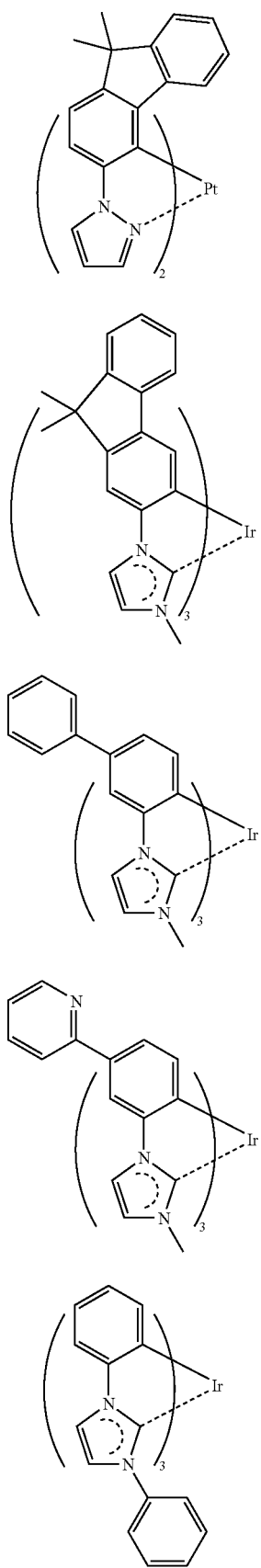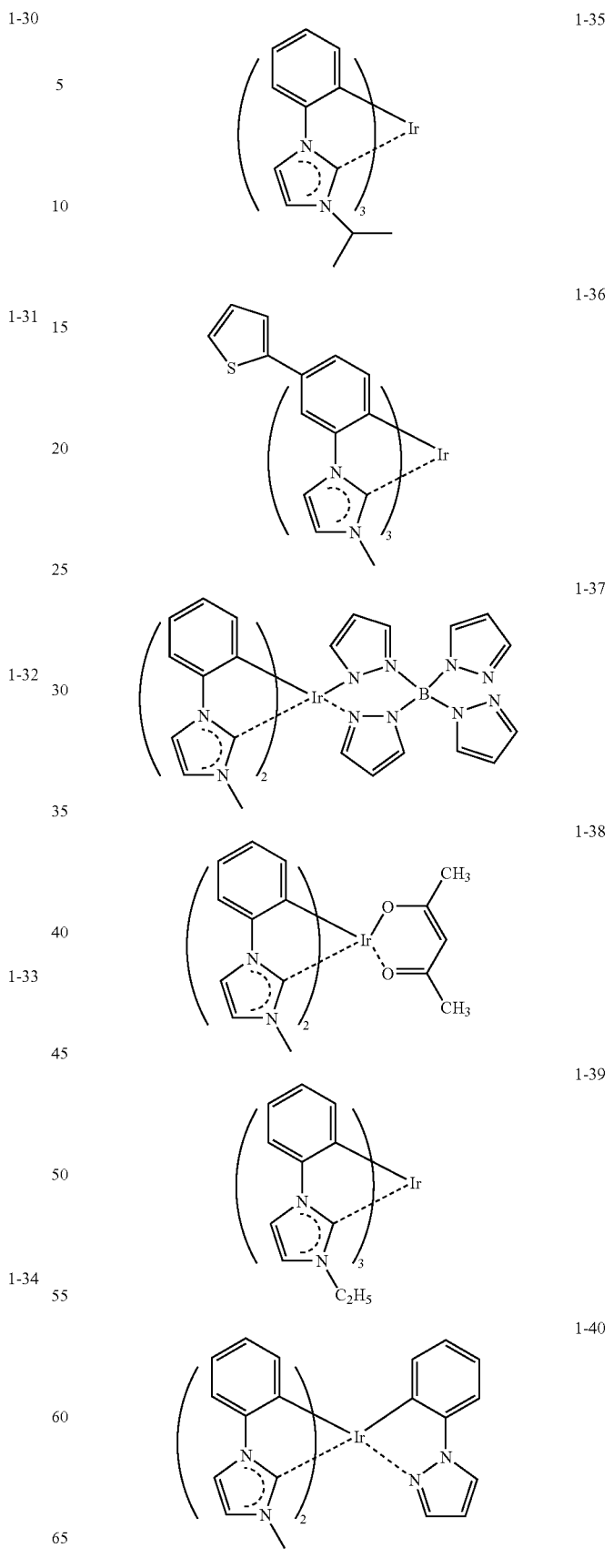

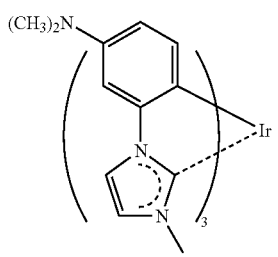
1-41
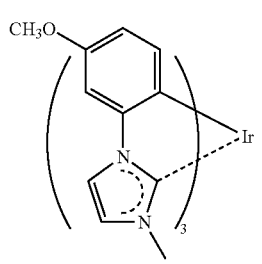
1-42
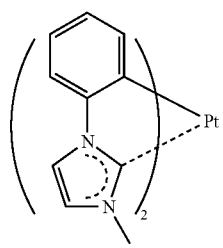
1-43
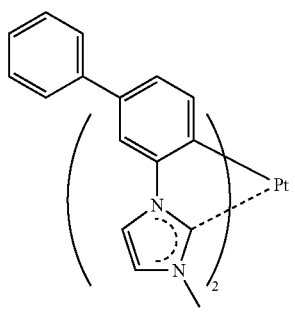
1-44
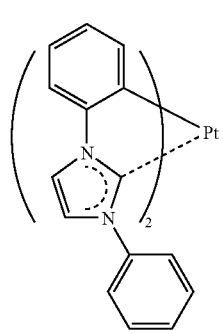
1-45
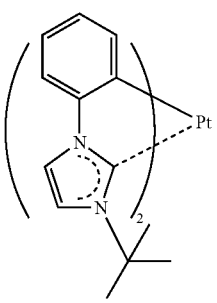
1-46
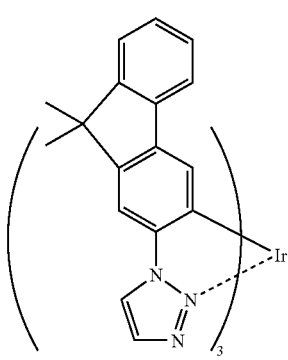
1-47
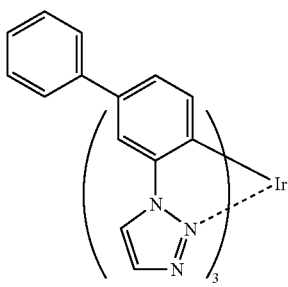
1-48
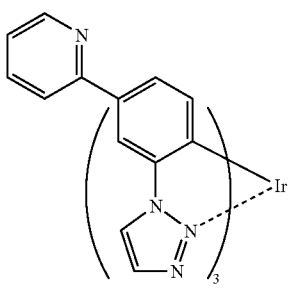
1-49
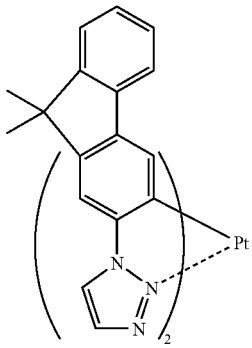
1-50

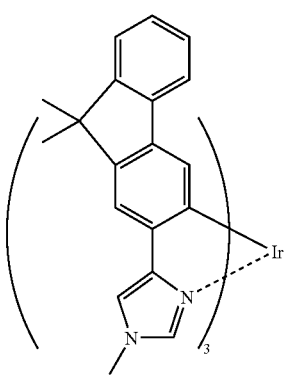 1-51
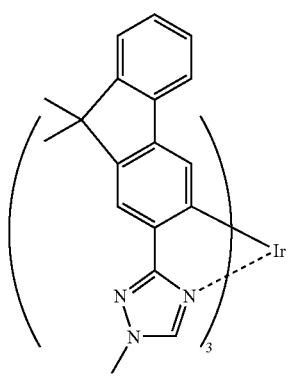 1-55
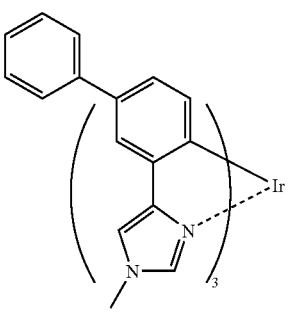 1-52
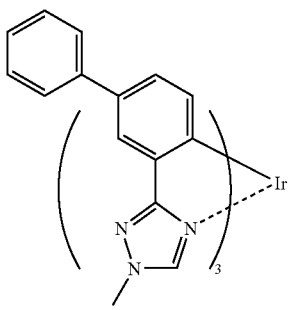 1-56
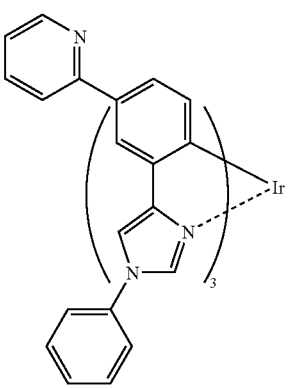 1-53
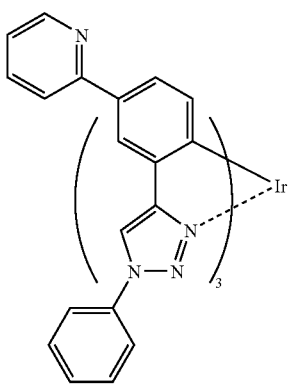 1-57
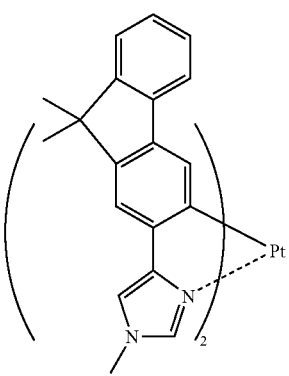 1-54
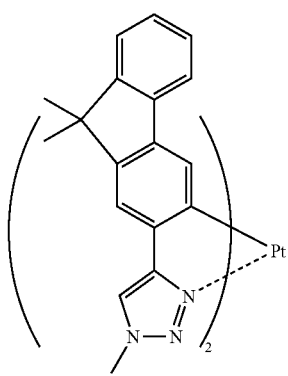 1-58

1-59 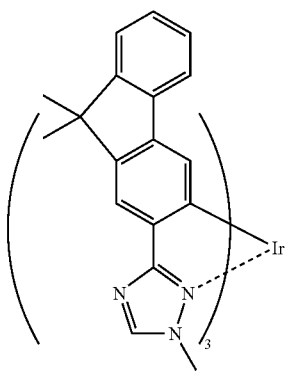
1-60 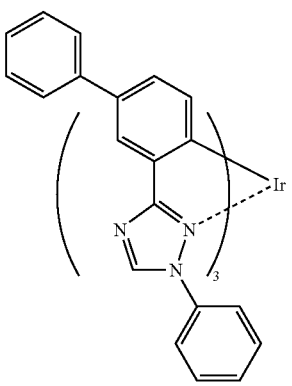
1-61 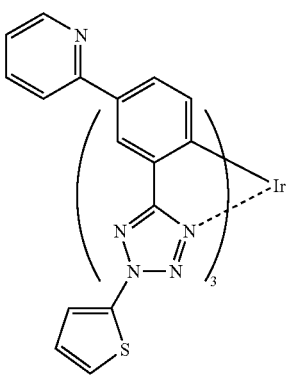
1-62 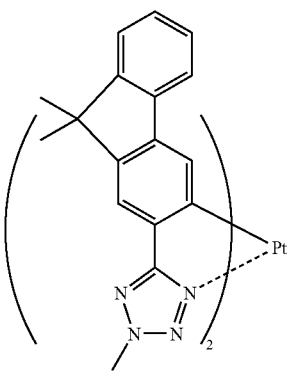
1-63 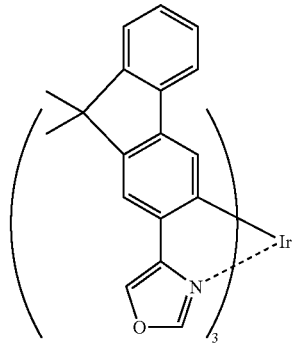
1-64 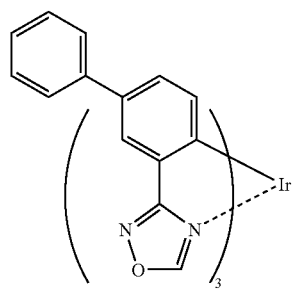
1-65 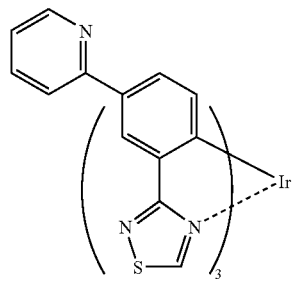
1-66 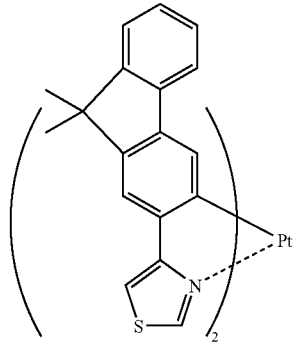
1-67 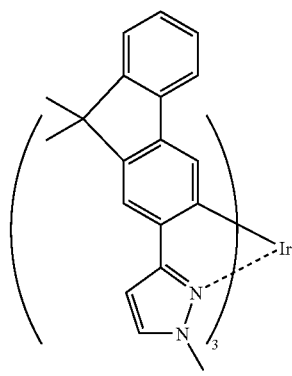

1-68
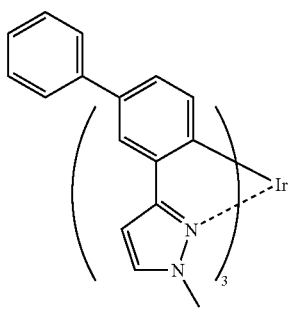

1-69
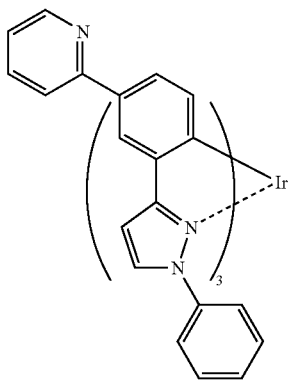

1-70
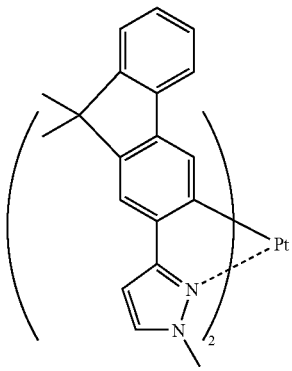

1-71
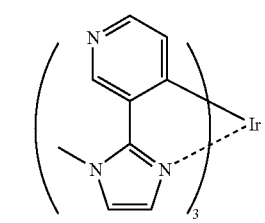

1-72
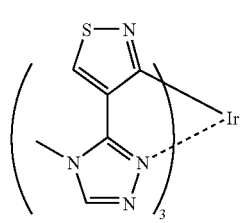

1-73
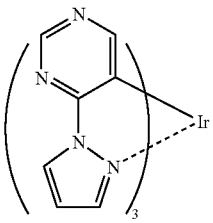

1-74
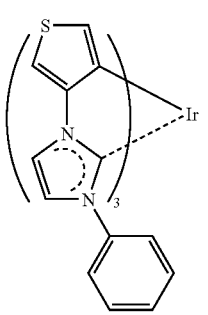

Metal complexes according to an organic EL element material of this invention can be synthesized by applying a method described in such as Organic Letter, vol. 3, No. 16, pp. 2579-2581 (2001), Inorganic Chemistry vol. 30, No. 8, pp. 1685-1687 (1991), J. Am. Chem. Soc., vol. 123, p. 4304 (2001), Inorganic Chemistry vol. 40, No. 7, pp. 1704-1711 (2001), Inorganic Chemistry vol. 41, No. 12, pp. 3055-3066 (2002), New Journal of Chemistry, vol. 26, p. 1171 (2002), European Journal of Organic Chemistry Vol. 4, pp. 95-709 (12004), and reference documents described in these documents.

The host compounds employed in the present invention will now be described.

Examples of the host compounds employed in the present invention include carbazole derivatives, azacarbazole derivatives, triazole derivatives, oxadiazole derivatives, imidazole derivatives, polyarylalkane derivatives, pyrazoline derivatives, pyrazolone derivatives, phenylenediamine derivatives, arylamine derivatives, phenanthroline derivatives, oxazole derivatives, styrylanthracene derivatives, fluorenone derivatives, hydrazone derivatives, stilbene derivatives, organic metal compounds, and arylmethane derivatives.

Of these, more preferred are the compounds represented by the following structure.

Formula (2)

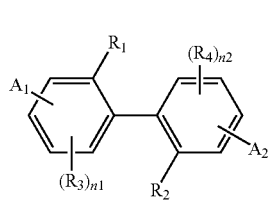

wherein $R_1$-$R_4$ each represents a substituent, n1 and n2 each represents an integer of 0-3, and $A_1$ and $A_2$ each represents the compound represented by following Formula (3).

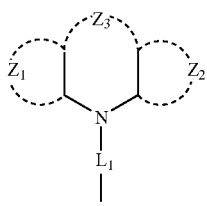

Formula (3)

wherein $Z_1$ and $Z_2$ each represents an aromatic heterocyclic ring which may have a substituent or an aromatic hydrocarbon ring, $Z_2$ represents a divalent linking group or a simple bonding hand, and $L_1$ represents a divalent linking group or a simple bonding hand.

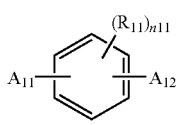

Formula (4)

wherein $R_{11}$ represents a substituent, n11 represents an integer of 0-4, and $A_{11}$ and $A_{12}$ each represents the compound represented by above Formula (3).

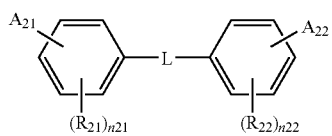

Formula (5)

wherein $R_{21}$ and $R_{22}$ each represents a substituent, n22 represents an integer of 0-3, $A_{21}$ and $A_{22}$ each represents the compound represented by above Formula (3), and L represents a divalent linking group.

Of Formulas (2), (3), and (5), it is more preferable that $Z_1$ and $Z_2$ of Formula (3) represents aromatic hydrocarbon.

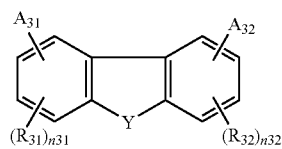

Formula (6)

wherein $A_{31}$ and $A_{32}$ each represents a substituent, n31 and n32 each represents an integer of 0-3, Y represents an oxygen atom, a sulfur atom, an imino group, or a sulfonyl group, and $R_{31}$ and $R_{32}$ each represents the compounds represented by Formula (3).

Examples of the substituents represented by $R_1$-$R_4$, $R_{11}$, $R_{21}$, $R_{31}$, and $R_{32}$ in above Formulas (2), (4), (5), and (6) include an alkyl group (having preferably 1-20 carbon atoms but more preferably 1-8 carbon atoms, such as methyl, ethyl, iso-propyl, tert-butyl, n-octyl, n-decyl, n-hexadecyl, cyclopropyl, cyclopentyl, or cyclohexyl), an alkenyl group having preferably 2-20 carbon atoms, more preferably 2-12 carbon atoms, but most preferably 2-8 carbon atoms, such as vinyl, allyl, 2-butenyl or 3-pentenyl), an alkynyl group (having preferably 2-20 carbon atoms, more preferably 2-12 carbon atoms, but most preferably 2-8 carbon atoms, such as propargyl or 3-pentynyl), an aryl group (having preferably 6-30 carbon atoms, more preferably 6-20 carbon atoms, but most preferably 6-12 carbon atoms, such as phenyl, p-methylphenyl, or naphthyl), an amino group (having preferably 0-20 carbon atoms, more preferably 0-10 carbon atoms, but most preferably 0-6 carbon atoms, such as amino, methylamino, dimethylamino, diethylamino, or dibenzylamino), an alkoxy group (having preferably 1-20 carbon atoms, more preferably 1-12 carbon atoms, but most preferably 1-8 carbon atoms, such as methoxy, ethoxy, or butoxy), an aryloxy group (having preferably 6-20 carbon atoms, more preferably 6-16 carbon atoms, but most preferably 6-12 carbon atoms, such as phenoxy or 2-naphthyloxy), an acyl group (having preferably 1-20 carbon atoms, more preferably 1-16 carbon atoms, but most preferably 1-12 carbon atoms, such as acetyl, benzoyl, formyl, or pivaloyl), an alkoxycarbonyl group (having preferably 2-20 carbon atoms, more preferably 2-16 carbon atoms, but most preferably 2-12 carbon atoms, such as methoxycarbonyl or ethoxycarbonyl), an aryloxycarbonyl group (having preferably 7-20 carbon atoms, more preferably 7-16 carbon atoms, but most preferably 7-10 carbon atoms, such as phenyloxycarbonyl), an acyloxy group (having preferably 2-20 carbon atoms, more preferably 2-16 carbon atoms, but most preferably 2-10 carbon atoms, such as acetoxy or benzoyloxy), an acylamino group (having preferably 2-20 carbon atoms, more preferably 2-16 carbon atoms, but most preferably 2-10 carbon atoms, such as acetylamino or benzoylamino), an alkoxycarbonylamino group (having preferably 2-20 carbon atoms, more preferably 2-16 carbon atoms, but most preferably 2-12 carbon atoms, such as methoxycarbonylamino), an aryloxycarbonylamino group (having preferably 7-20 carbon atoms, more preferably 7-16 carbon atoms, but most preferably 7-12 carbon atoms, such as phenyloxycarbonylamino group), a sulfonylamino group (having preferably 1-20 carbon atoms, more preferably 1-16 carbon atoms, but most preferably 1-12 carbon atoms, such as methanesulfonylamino or benzenesulfonylamino), a sulfamoyl group (having preferably 0-20 carbon atoms, more preferably 0-16 carbon atoms, but most preferably 0-12 carbon atoms, such as sulfamoyl, methylsulfamoyl, dimethylsulfamoyl, or phenylsulfamoyl), a carbamoyl group (having preferably 1-20 carbon atoms, more preferably 1-16 carbon atoms, but most preferably 1-12 carbon atoms, such as carbamoyl, methylcarbamoyl, diethylcarbamoyl, or phenylcarbamoyl, an alkylthio group (having preferably 1-20 carbon atoms, more preferably 1-16 carbon atoms, but most preferably 1-12 carbon atoms, such as methylthio or ethylthio), an arylthio group (having preferably 6-20 carbon atoms, more preferably 6-16 carbon atoms, but most preferably 6-12 carbon atoms, such as phenylthio), a sulfonyl group (having preferably 1-20 carbon atoms, more preferably 1-16 carbon atoms, but most preferably 1-12 carbon atoms, such as mesyl or tosyl), a sulfinyl group (having preferably 1-20 carbon atoms, more preferably 1-16 carbon atoms, but most preferably 1-2 carbon atoms, such as methanesulfinyl or benzenesulfinyl), a ureido group (having preferably 1-20 carbon atoms, more preferably 1-16 carbon atoms, but most preferably 1-12 carbon atoms, such as methylureido or phenylureido), a phosphoric acid amido group (having preferably 1-20 carbon atoms, more preferably 1-16 carbon atoms, but most preferably 1-12 carbon atoms, such as diethylphosphoric acid amide or phenylphosphoric acid amide), a hydroxyl group, a mercapto group, a halogen atom (such as a fluorine atom, a chlorine atom, a bromine atom, or an iodine atom), a cyano group, a sulfo group, a carboxyl group, a nitro group, hydroxamic acid group, a sulfino group, a hydrazino group, an imino group, a heterocyclyl group (having a heteroatom(s), such as a nitrogen atom, an oxygen atom, a sulfur atom, or a selenium atom, and also having preferably 1-30 carbon atoms, or more preferably 1-20 carbon atoms, such as imidazolyl, pyridyl, furyl, piperidyl, or morpholino). These substituents may be further substituted. Further, if possible, a ring may be formed via linking.

Of these, preferred are the alkyl group and the aryl group.

The divalent linking groups represented by $L_1$ and $L_2$ in Formulas (2) and (4) may be hydrocarbon groups such as alkylene, alkenylene, or arylene, in addition, those containing a heteroatom, as well as divalent linking groups such as a thiophene-2,5-diyl group or a pyrazine-2,3-diyl group which are derived from compounds having an aromatic heterocyclic ring, and chalcogen atoms such as oxygen or sulfur. Further, they may be linking groups which are linked via a heteroatom such as an alkylimino group, a dialkylsilanediyl group, or an diarylgermandiyl group.

It is possible to employ, as the organic compound employed in the present invention, either low- or high-molecular compounds.

With regard to the low-molecular compounds, it is more preferable that the film surface density of at least one organic layer is 1.20-1.25 $g/cm^2$, and their molecular weight is 400-2,000. Due to that, the voltage increase when driven at a constant electric current is markedly minimized and the storage stability under high temperature and high humidity is significantly improved.

High-molecular compounds, as described herein, are those prepared by polymerizing compounds (polymerizable compounds) having at least one polymerizable group. Examples of the polymerizable groups include a vinyl group, an epoxy group, an oxetane group, an isocyanate group, and a thioisocyanate group. Of these, preferred is the vinyl group. The organic compounds represented by Formulas (1)-(5) may have these polymerizable groups in any position within the molecule.

The polymerization reaction of polymerizable compounds will now be described. When polymerization is carried out, previously polymerized polymers may be employed, or polymerization may be carried out either in a solution prior to preparation of elements or during the period of preparation of elements. Alternately, bonds may be formed after preparation of elements. When the polymerization reaction is initiated, energy (such as heat, light, or ultrasonic waves) may be supplied from the exterior, or the reaction may be initiated by the addition of polymerization initiators, acid catalysts or basic catalysts. Further, when the polymerization reaction is initiated via incorporation of the compounds according to the present invention in light emitting elements, the reaction may be initiated via supplied electric current during driving of the light emitting elements, or generated light or heat. Further, a copolymer may be formed via polymerization of at least two polymerizable compounds.

The weight average molecular weight of polymerized high-molecular compounds is preferably 5,000-1,000,000, but is more preferably 5,000-200,000.

Further, it is more preferable that the film density is 1.10-1.15 $g/cm^3$ while the molecular weight is 5,000-1,000,000. By regulating these factors within the above range, any voltage increase during constant electric current driving and formation of dark spots are significantly minimized, and storage stability at high temperature and high humidity is also significantly enhanced.

Examples of radical polymerization initiators include azo based initiators such as 2,2'-azobisbutyronitrile, 2,2'-azobiscyclohexanecarbonitrile, 1,1'-azobis(cyclohexane-1-carbonitrile), 2,2'-azobis(2-methylbutyronitryl), 2,2'-azobis(2,4-dimethylvaleronitrile), 2,2-azobis(4-methoxy-2,4-dimethylvaleronitrile), 4,4'-azobis(4-cyanovaleric acid), dimethyl 2,2-azobisisobutyrate, 2,2'-azobis(2-methylpropionamidoxime), 2,2'-azobis(2-(2-imidazoline-2-yl)propane), or 2,2'-azobis(2,4,4-trimethylpentane); peroxide based initiators such as benzoyl peroxide, di-t-butyl peroxide, t-butyl hydroperoxide, or cumene hydroperoxide; and aromatic carbonyl based initiators such as diethoxyacetophenone, 2-hydroxy-2-methyl-1-phenylpropane-1-one, benzyldimethylketal, benzyl-β-methoxyethylacetal, 1-(4-isopropylphenyl)-2-hydroxy-2-methylpropane-1-one, 4-(2-hydroxyethoxy)phenyl-(2-hydroxy-2-propyl)ketone, 1-hydroxycyclohexyl phenyl ketone, 4-phenoxydichloroacetophenone, 4-t-butyldichloroacetophenone, 4-t-butytrochloroacetophenone, 1-(4-dodecylphenyl)-2-hydroxy-2-methylpropane-1-one. Further, it is possible to employ disulfide based initiators such as tetraethylthiuram disulfide, nitroxyl initiators such as 2,2,6,6-tetramethylpiperidine-1-oxyl, and living radical initiators such as a 4,4'-di-t-butyl-2,2'-bipyridine-methyl trichloroacetate composite.

It is possible to employ, as a catalyst, white clay such as active white clay or acidic white clay; mineral acids such as sulfuric acid or hydrochloric acid; organic acids such as p-toluenesulfonic acid or trifluoroacetic acid; Lewis acids such as aluminum chloride, ferric chloride, stannic chloride, titanium trichloride, titanium tetrachloride, boron trifluoride, hydrogen fluoride, boron tribromide, aluminum bromide, gallium chloride, or gallium bromide; further, solid acids such as zeolite, silica, alumina, silica-alumina, and cation exchange resins; and heteropoly acids (for example, phosphotungstic acid, phosphomolybdic acid, silicotungstic acid, and silicomolybdic acid).

As basic catalysts employed in the present invention listed may be alkaline metal carbonates such as $Li_2CO_3$, $Na_2CO_3$, or $K_2CO_3$; alkaline earth metal carbonates such as $BaCO_3$ or $CaCO_3$; alkaline metal oxides such as $Li_2O$, $Na_2O$, o $K_2O$; alkaline earth metal oxides such as $BaO$ or $CaO$; alkaline metals such as Na or K; alkaline metal hydroxides such as sodium hydroxide or potassium hydroxide; and alkoxides of sodium, potassium, rubidium, or cesium.

Specific examples of the host compounds according to the present invention and polymerizable compounds which become host compounds will now be listed, however, the present invention is not limited thereto.

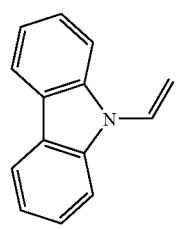

A1

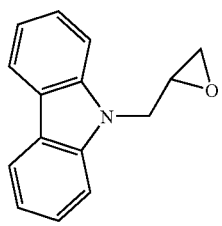

A2

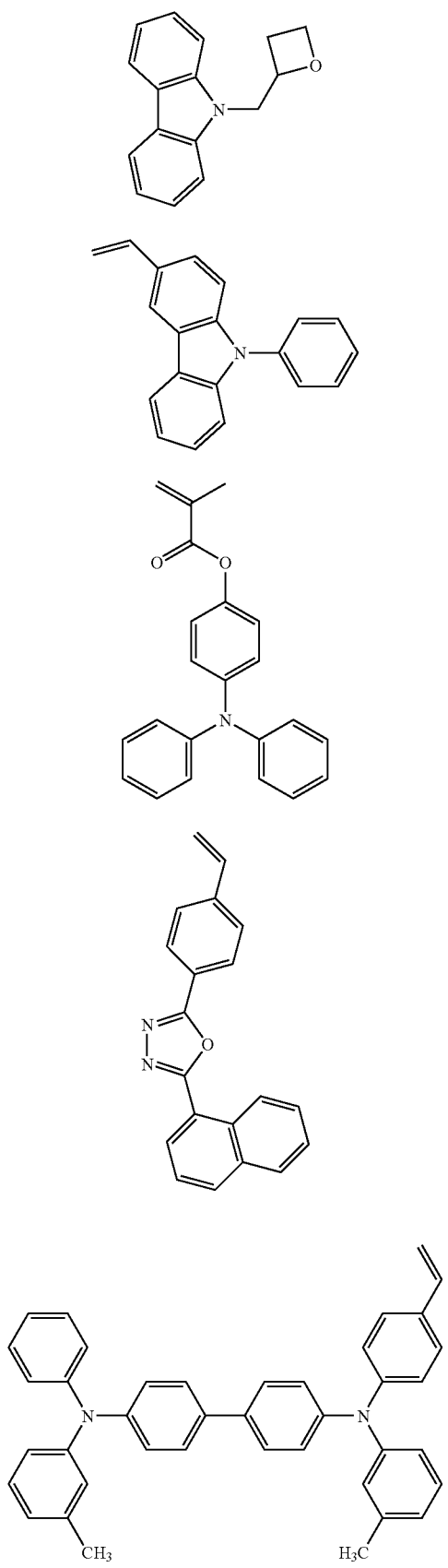
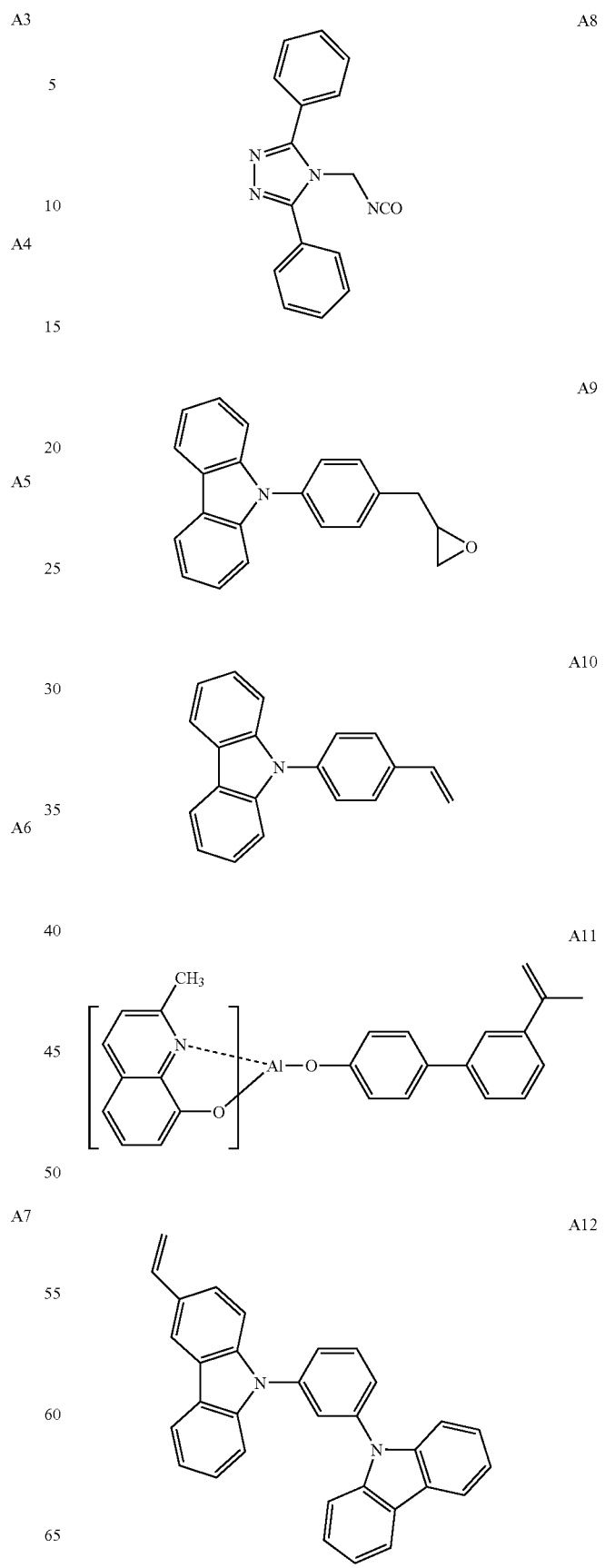

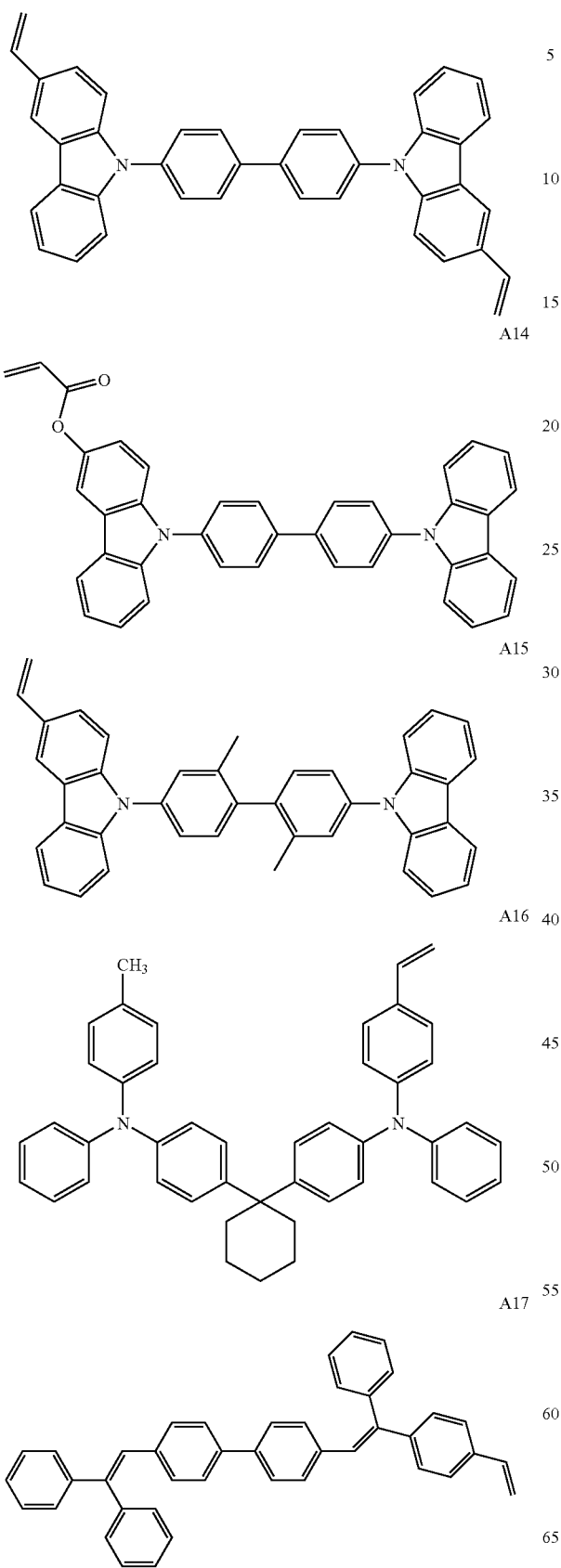
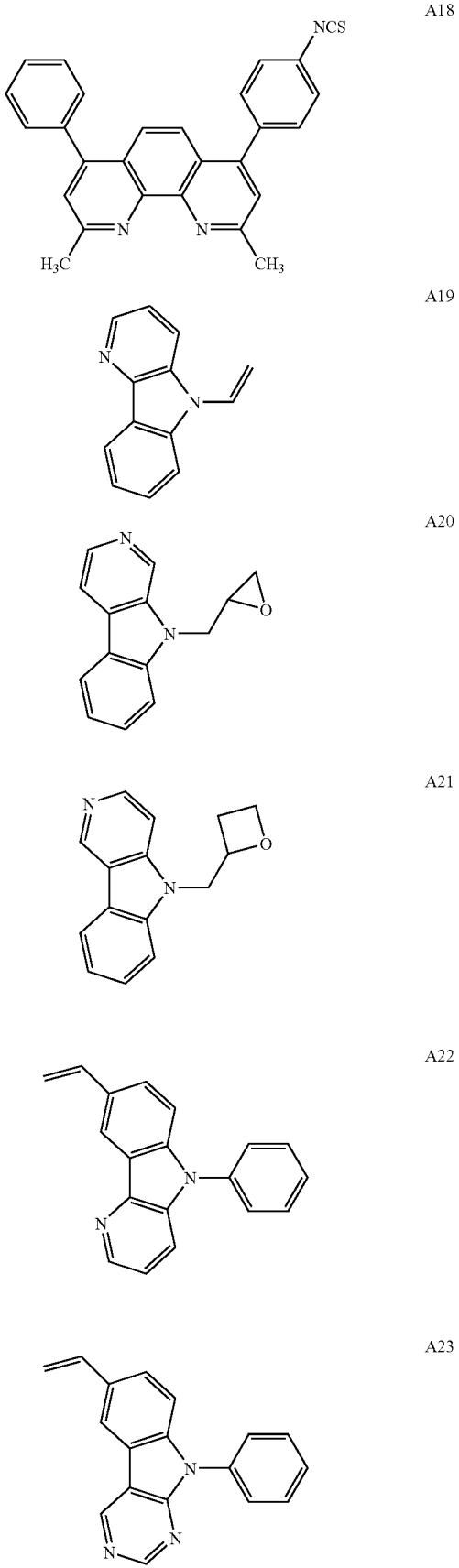

-continued
A24
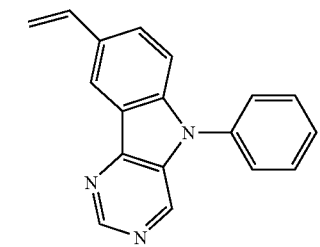
A25
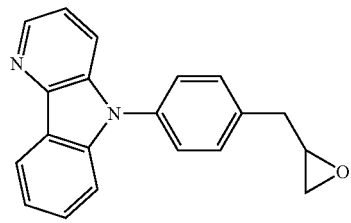
A26
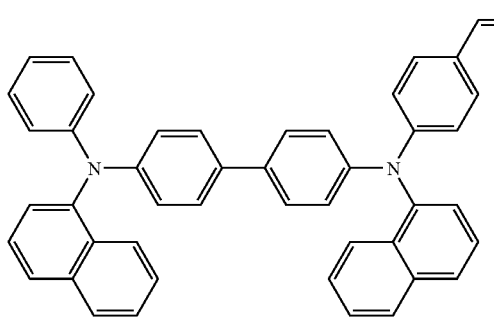
A27
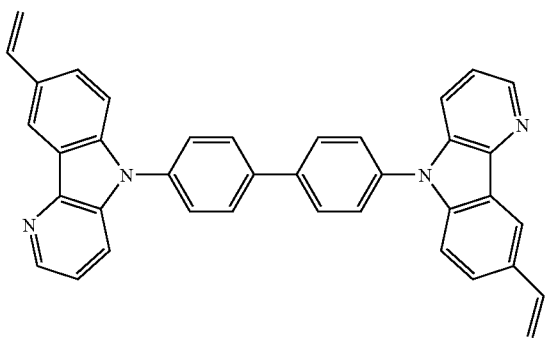
A28
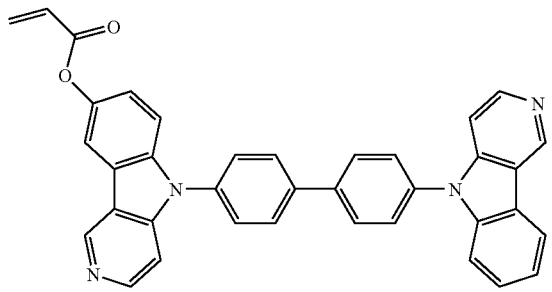
-continued
A29
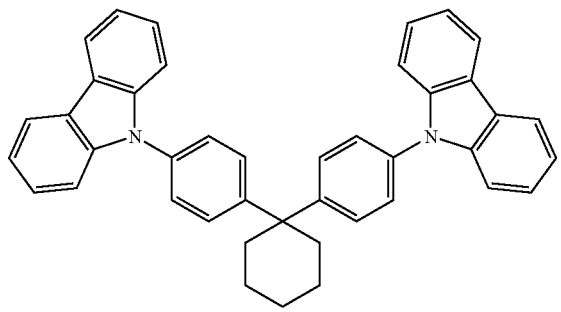
A30
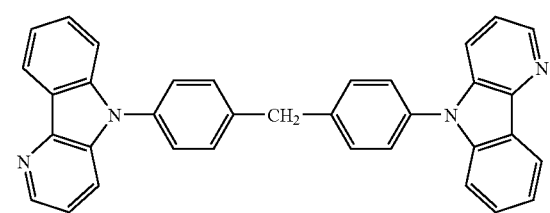
A31
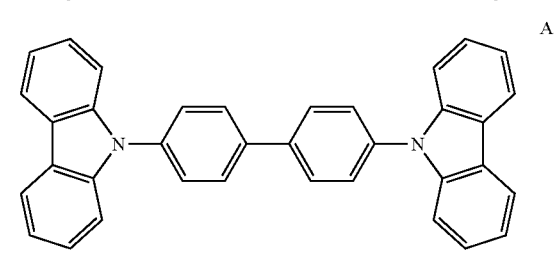
A32
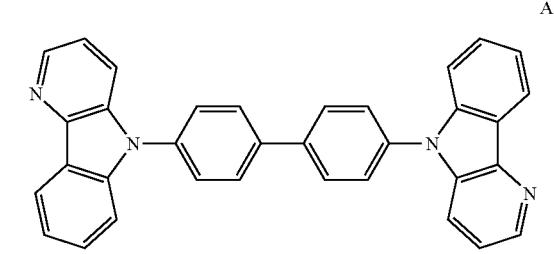
A33
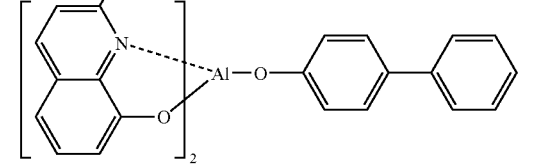
A34
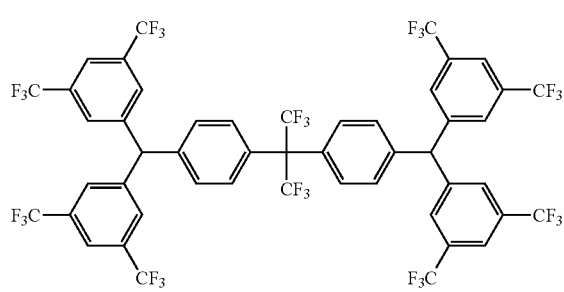

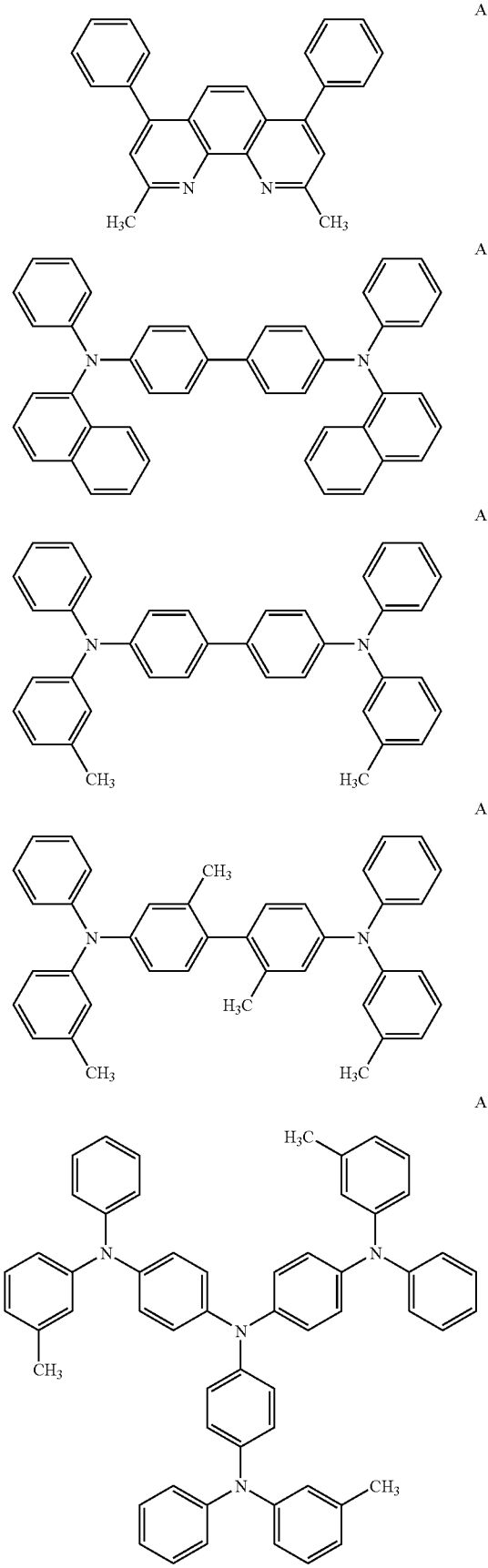
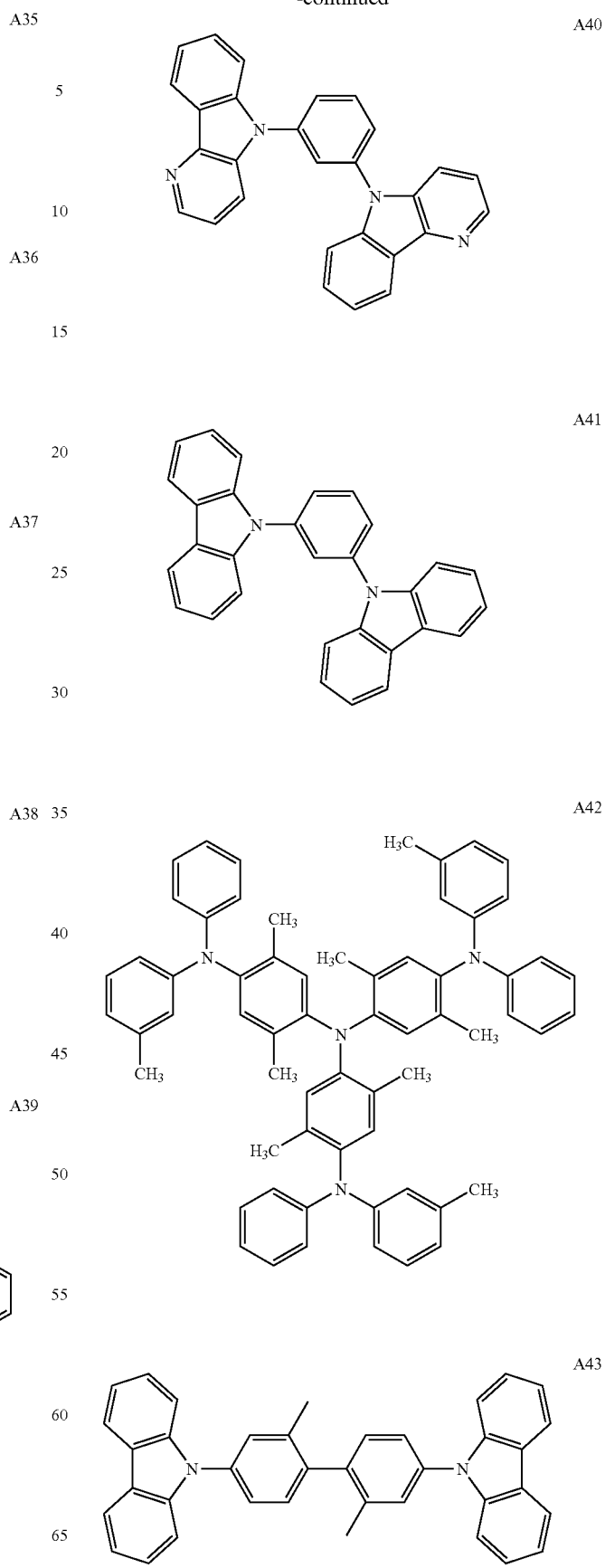

A44
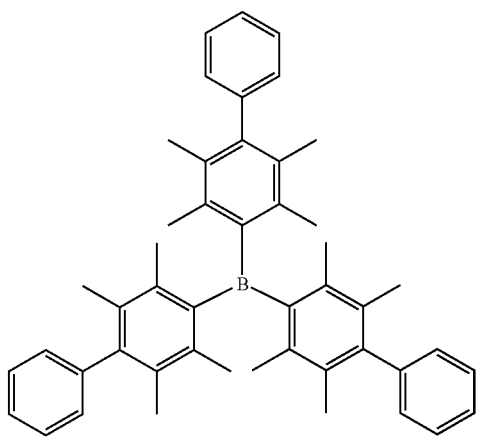

A45
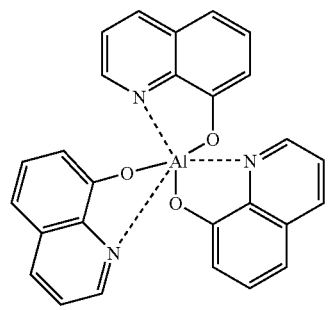

A46
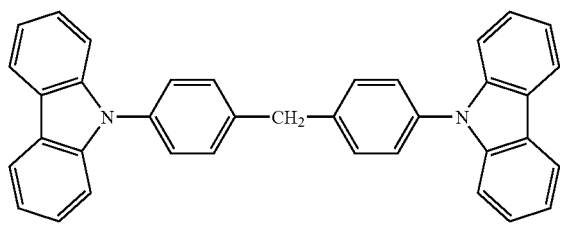

A47
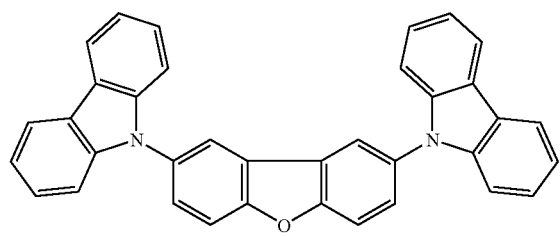

A48
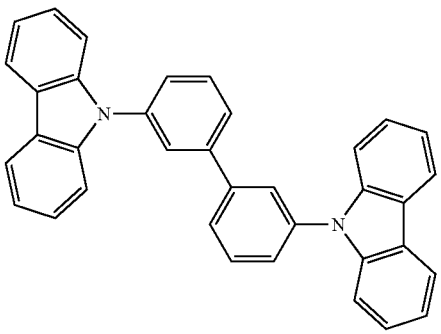

A49
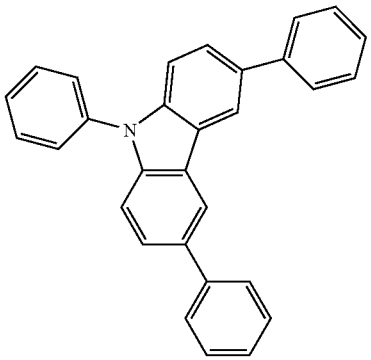

The phosphorescent compounds represented by Formula (1) of the present invention may be employed together with other phosphorescent or fluorescent compounds.

The phosphorescent compounds employed in the present invention are preferably complex based compounds which incorporate metals in Group VIII of the element periodic table. Of these, further preferred are iridium compounds, osmium compounds, or platinum compounds (specifically platinum complex based compounds), and the iridium compounds are most preferred.

Specific examples of the phosphorescent compounds employed in the present invention will now be listed, however, the present invention is not limited thereto. It is possible to synthesize these compounds based on the method described, for example, in Inorg. Chem. Volume 40, 1704-1711. Further, simultaneously employed fluorescent and phosphorescent compounds may or may not have either a polymerizable or a reactive group.

Ir-1
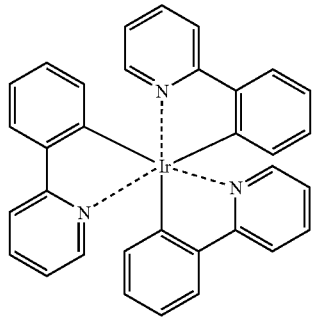

Ir-2
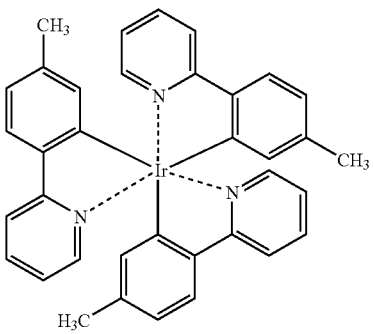

Ir-3
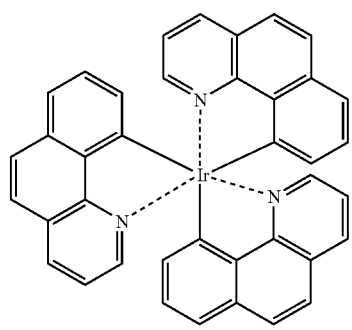
Ir-4
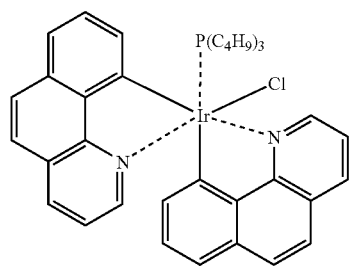
Ir-5
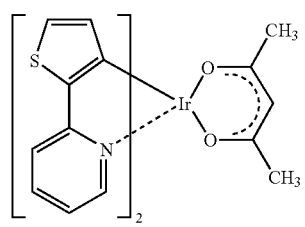
Ir-6
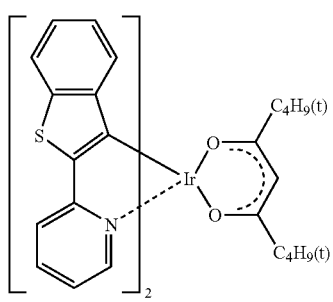
Ir-7
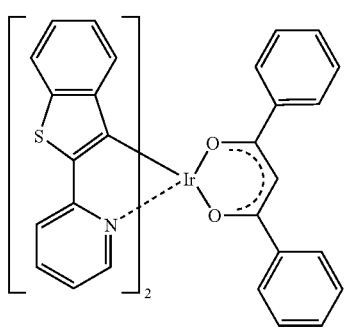
Ir-8
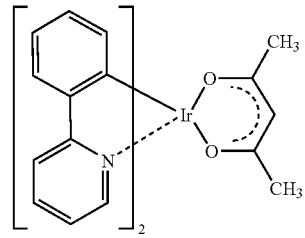
Ir-9
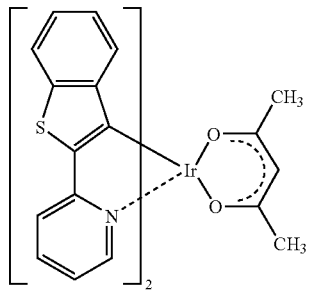
Ir-10
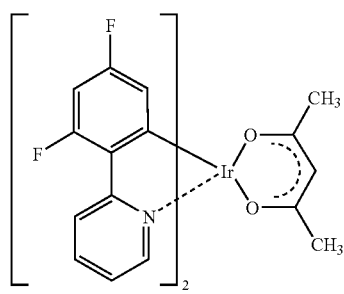
Ir-11
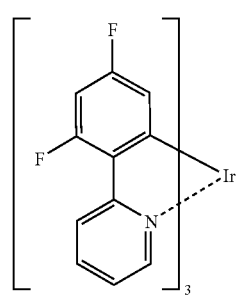
Ir-12
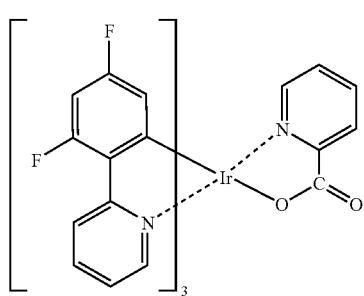

Ir-13

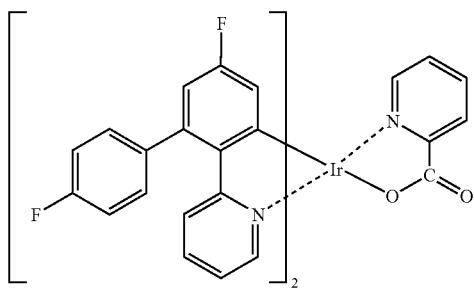

Pt-1

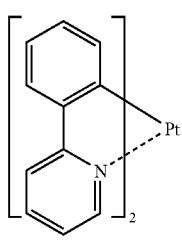

Pt-2

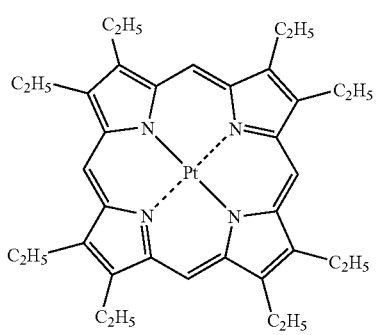

A-1

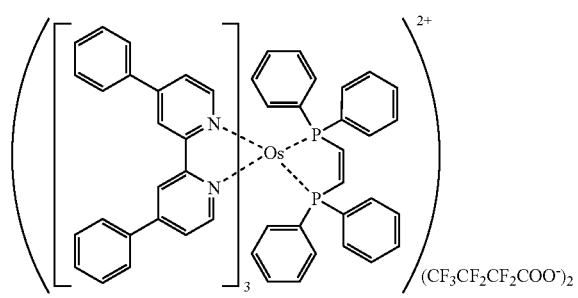

D-1

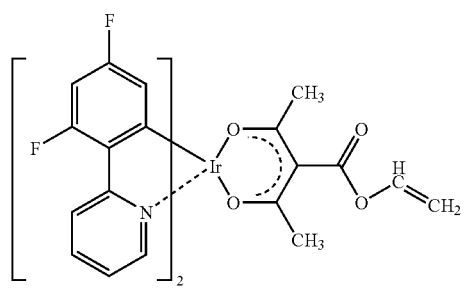

D-2

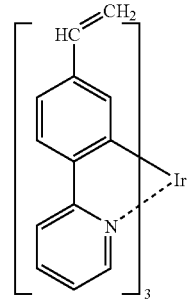

D-3

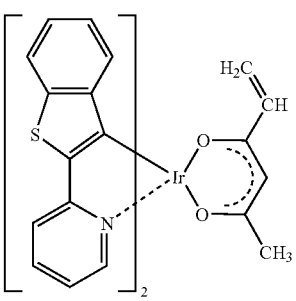

D-4

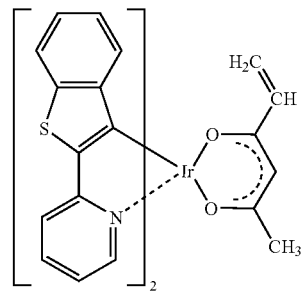

Fluorescent compounds employed in the present invention refer to those which emit fluorescence having a maximum emitted light wavelength which differs from the case in which the above fluorescent compound is not incorporated. Preferred compounds are those which exhibit a relatively high fluorescent quantum yield in a solution state. The fluorescent quantum yield is preferably at least 10%, but is more preferably at least 30%. Specific examples of such fluorescent compounds include coumarin based dyes, anthracene based dyes, pyran based dyes, cyanine based dyes, croconium based dyes, squarylium based dyes, oxobenzanthracene based dyes, fluorescein based dyes, rhodamine based dyes, pyrylium based dyes, perylene based dyes, stilbene based dyes, polythiophene based dyes, or rare earth complex based phosphors. It is possible to determine the fluorescent quantum yield, as described herein, based on the method described on page 362 of Bunko II, Dai 4 Han Jikken Kagaku Koza (Spectroscopy II of 4th Edition Lectures of Experimental Chemistry) (1992 Edition, Maruzen Co.).

Specific examples of the fluorescent compounds according to the present invention will now be listed, however, the present invention is not limited thereto.

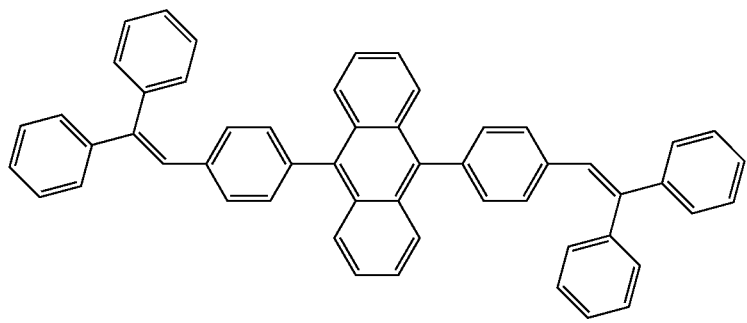
F1
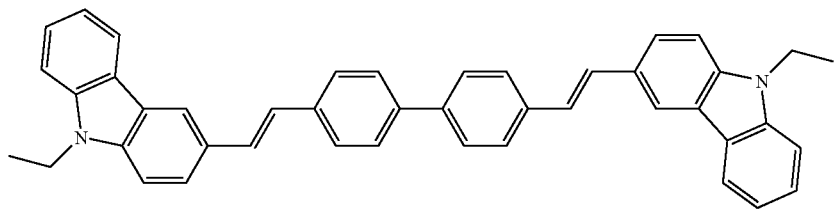
F2
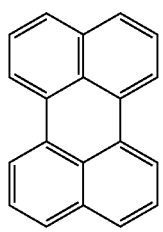
F3
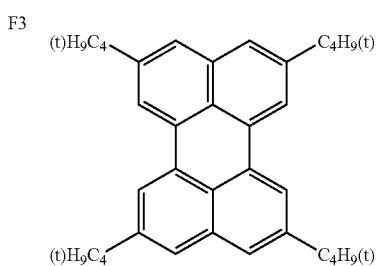
F4
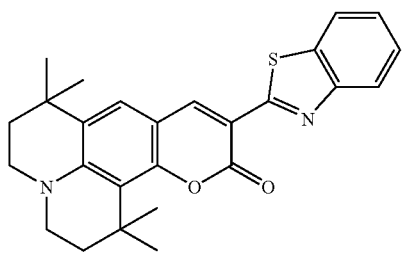
F5
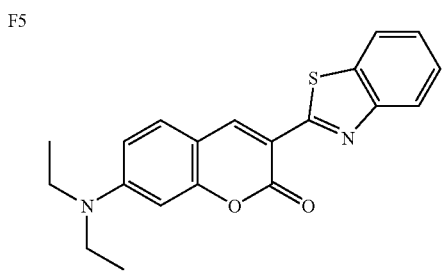
F6
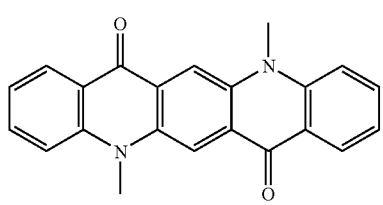
F7
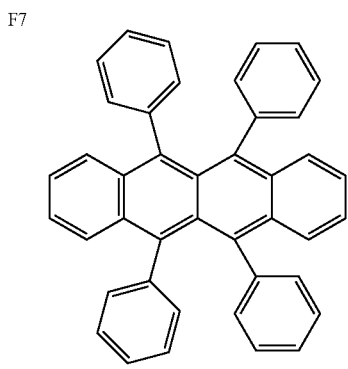
F8

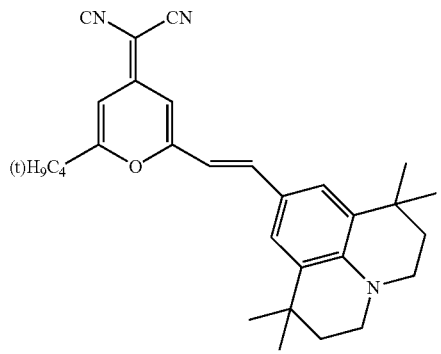

F9

<<Layer Configuration of Organic EL Element>>

The layer configuration of the organic EL element according to the present invention (hereinafter also referred to as the organic EL element) will now be described.

The organic EL element of the present invention incorporates a substrate having thereon an electrode (a cathode and an anode) and at least one of the organic layers in which at least one layer is a light emitting layer incorporating phosphorescent compounds.

In a broad sense, the light emitting layer according to the present invention refers to the layer which emits light when electrodes composed of a cathode and an anode are energized, and specifically refers to the layer which incorporates compounds which emit light when an electrode composed of a cathode and an anode is energized.

If desired, the organic layer of the present invention may have, other than the light emitting layer, a positive hole transporting layer, an electron transporting layer, an anode buffer layer, and a cathode buffer layer, and is sandwiched between the anode and the cathode. Specific structures include the following:

(i) anode/positive hole transporting layer/light emitting layer/cathode
(ii) anode/light emitting layer/electron transporting layer/cathode,
(iii) anode/positive hole transporting layer/light emitting layer/electron transporting layer/cathode, and
(iv) anode/anode buffer layer/positive hole transporting layer/light emitting layer/electron transporting layer/cathode buffer layer/cathode Of a plurality of layers which is sandwiched between electrodes (the anode and the cathode), which constitutes the above organic EL element, the organic layer is composed of at least two layers, but is preferably composed of at least three layers.

<<Light Emitting Layer>>

It is preferable that host compounds and phosphorescent compounds (hereinafter also referred to as phosphorescence emitting compounds) are incorporated into the light emitting layer of the organic EL element of the present invention, whereby it is possible to further enhance light emission efficiency.

Of compounds incorporated in the light emitting layer, "host compound" as described in the present invention, is defined as a compound exhibiting a phosphorescent quantum yield of less than 0.01 at room temperature.

A plurality of types of host compounds may be simultaneously employed. By employing a plurality of types of host compounds, it is possible to regulate the movement of electric charges, and enables enhancement of the efficiency of the organic EL element. Further, by employing a plurality of types of phosphorescent compounds, it is possible to mix different emitted light, and it is possible to prepare any of the emitted light colors, whereby applications to lighting and backlight become possible.

Preferred host compounds according to the present invention are those which exhibit positive hole transportability and electron transportability, minimize extension to the longer wavelength of emitted light, and exhibit high Tg (glass transition temperature). The host compounds exhibit any of the injection or transportation of positive holes, and electron blocking. Examples thereof include carbazole derivatives, azacarbazole derivatives, triazole derivatives, oxadiazole derivatives, imidazole derivatives, polyalkane derivatives, pyrazoline derivatives, pyrazolone derivatives, phenylenediamine derivatives, arylamine derivatives, phenanthroline derivatives, oxazole derivatives, styrylanthracene derivatives, fluorenone derivatives, hydrazone derivatives, stilbene derivatives, organic metal compounds, and arylmethane derivatives.

Of these, it is preferable to employ the carbazole derivatives and the azacarbazole derivatives.

The thickness of the light emitting layer, prepared as above, is not particularly limited and may be appropriately selected based on specific conditions. However, it is preferable to regulate the layer thickness within the range of 5 nm-5 μm.

Other layers such as a positive hole injecting layer, a positive hole transporting layer, an electron injecting layer, or an electron transporting layer will now be described which are combined with the light emitting layer to constitute an organic EL element.

<<Positive Hole Injecting Layer, Positive Hole Transporting Layer, Electron Injecting Layer, and Electron Transporting Layer>>

The positive hole injecting layer and the positive hole transporting layer, employed in the present invention, transfer positive holes injected from the anode to the light emitting layer. By placing the above positive hole injecting layer and positive hole transporting layer between the anode and the light emitting layer, many positive holes are injected into the light emitting layer in a lower electric field, and further, electrons, which are injected into the light emitting layer from the anode, the electron injecting layer, or the electron transporting layer, are accumulated in the boundary in the light emitting layer due to the presence of the electron blocking wall between the light emitting layer and the positive hole injecting layer or the positive hole transporting layer, whereby an element is prepared which exhibits excellent light emitting performance such as enhancement of light emitting efficiency.

<<Positive Hole Injecting Materials and Positive Hole Transporting Materials>>

Materials of the above positive hole injecting layer and positive hole transporting layer (hereinafter referred to as positive hole injecting materials and positive hole transporting materials) are not particularly limited as long as they exhibit the function to transfer positive holes injected from the above anode to the light emitting layer. It is possible to employ those which are conventionally employed as a charge injecting and transporting layer of positive holes in photoconductive materials, and which are selected from any of the prior art materials employed in the positive hole injecting layer and the positive hole transporting layer of EL elements.

The aforementioned positive hole injection material and positive hole transport material are those having any one of a property to inject or transport a positive hole or a barrier property to an electron, and may be either an organic substance or an inorganic substance. For example, listed are a triazole derivative, an oxadiazole derivative, an imidazole derivative, a polyallylalkane derivative, a pyrazolone derivative, a phenylenediamine derivative, a allylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive polymer oligomer and specifically preferably such as thiophene oligomer. As a positive hole injection material and a positive hole transport material, those described above can be utilized, however, it is preferable to utilized a porphyrin compound, an aromatic tertiary amine compound and a styrylamine compound, and specifically preferably an aromatic tertiary amine compound.

Typical examples of an aromatic tertiary amine compound and a styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-methyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quarterphenyl; N,N,N-tri(p-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N, N-diphenylaminostilbene; and N-phenylcarbazole, in addition to those having two condensed aromatic rings in a molecule described in U.S. Pat. No. 5,061,569, such as 4, 4'-bis[N-(1-naphthyl)-N-phenylamino]biphenyl (NDP), and 4, 4', 4"-tris[N-(3-methylphenyl)-N-phenylamino]triphenylamine (MDTDATA), in which three of triphenylamine units are bonded in a star burst form, described in JP-A 4-308688. Polymer materials, in which these materials are introduced in a polymer chain or constitute the main chain of polymer, can be also utilized.

Further, an inorganic compound such as a p type-Si and a p type-SiC can be utilized as a positive hole injection material and a positive hole transport material. The positive hole injection layer and the positive hole transport layer can be prepared employing the above-described positive hole injection material and positive hole transport material with a thin layer forming method well known in the art such as a vacuum evaporation method, a spin coating method, a cast method, and a LB method.

(Layer Thickness of a Positive Hole Injection Layer and a Positive Hole Transport Layer)

The layer thickness of a positive hole injection layer and a positive hole transport layer is not specifically limited, however, is generally 5 nm-5 µm. These positive hole injection layer and transport layer may have a single layer structure or two or more layer structures comprised of one or not less than two types of the above described materials.

<Electron Transport Layer, Electron Transport Material>

An electron transfer layer is provided with a function to transmit an electron injected from a cathode to an emission layer, and compounds conventionally well known in the art can be utilized by arbitrarily selection as a material thereof.

Examples of a material utilized in this electron transfer layer (hereinafter, referred to as an electron transfer material) include such as a nitro-substituted fluorene derivative, a diphenylquinone derivative, a thiopyradineoxide derivative, a heterocyclic tetracarbonic acid anhydride such as naphthaleneperylene, carbodiimide, a fluorenylidenemethane derivative, anthraquinonedimethane and anthrone derivatives, and an oxadiazole derivative. Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transfer material. Polymer materials, in which these materials are introduced in a polymer chain or these materials form the main chain of polymer, can be also utilized.

Further, a metal complex of a 8-quinolinol derivative such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transfer material.

Further, metal-free or metal phthalocyanine, or those the terminal of which is substituted by an alkyl group and a sulfonic acid group, can be preferably utilized as an electron transfer material. Further, distyrylpyrazine derivative, which has been exemplified as a material of an emission layer, can be also utilized as an electron transfer material, and, similarly to the case of a positive hole injection layer and a positive hole transfer layer, an inorganic semiconductor such as an n-type-Si and an n-type-SiC can be also utilized as an electron transfer material. (Thickness of an electron transport layer) The layer thickness of an electron transport layer is not specifically limited; however, is generally 5 nm-5 µm. This electron transport layer may have a single layer structure comprised of one or not less than two types of the above described materials. The electron transport layer may have a plural layer structures each containing the same composition or the different composition.

In the present invention, a buffer layer (an electrode interface layer) may be present between an anode and an emission layer or an positive hole injection layer, and between a cathode and an emission layer or an electron injection layer.

A buffer layer is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30, 1998, published by N. T. S Corp.)", and includes an anode buffer layer and a cathode buffer layer.

An anode buffer layer is also detailed in such as JP-A 9-45479, 9-260062 and 8-288069, and specific examples include such as a phthalocyanine buffer layer comprising such as copper phthalocyanine, an oxide buffer layer comprising such as vanadium oxide, an amorphous carbon buffer layer, and a polymer buffer layer employing conductive polymer such as polythiophene.

A cathode buffer layer is also detailed in such as JP-A 6-325871, 9-17574 and 10-74586, and specific examples include a metal buffer layer comprising such as strontium and aluminum, an alkali metal compound buffer layer comprising such as lithium fluoride, an alkali earth metal compound buffer layer comprising such as magnesium fluoride, and an oxide buffer layer comprising such as aluminum oxide.

The above-described buffer layer is preferably a very thin layer, and the layer thickness is preferably in a range of 0.1-100 nm although it depends on a raw material.

The organic EL element of the present invention may have additional layers having a specific function when required. An example of the layers is a functional layer such as positive hole inhibiting layer (hole blocking layer) disclosed in JP-A 11-204258, 11-204359, and at page 237 in "Organic EL Elements and Industrialization Front thereof (Nov. 30, 1998, published by N. T. S Corp.)", and includes an anode buffer layer and a cathode buffer layer.

The organic layer according to the present invention is preferably made via any of the common coating methods. Examples of the coating methods are a spin coating, dip coating, roller coating, flexographic printing, screen printing, offset printing, or ink-jet method. Of these preferred is the ink-jet method.

<Electrodes>

Electrodes of an organic EL element will be described. The electrodes of an organic EL element are comprised of an anode and a cathode. As an anode of an organic EL element are made of a metal, an alloy, a conductive compound, which is provided with a large work function (not less than 4 eV), and a mixture thereof as an electrode substance are preferably utilized. Specific examples of such an electrode substance include a conductive transparent material such as metal like Au, CuI, indium tin oxide (ITO), $SnO_2$ and ZnO.

As for an anode, these electrode substances may be made into a thin layer by a method such as evaporation or spattering and a pattern of a desired form may be formed by means of photolithography, or in the case of requirement of pattern precision is not so severe (not less than 100 µm), a pattern may be formed through a mask of a desired form at the time of evaporation or spattering of the above-described substance. When emission is taken out of this anode, the transmittance is preferably set to not less than 100 and the sheet resistance as an anode is preferably not more than a few hundreds Ω/□. Further, although the layer thickness depends on a material, it is generally selected in a range of 10 nm-1 µm and preferably of 10-200 nm.

On the other hand, as a cathode, a metal (called as an electron injection metal), an alloy, a conductive compound and a mixture thereof, which have a small work function (not more than 4 eV), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal. Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum.

A for a cathode, these electrode substances may be made into a thin layer by a method such as evaporation or spattering. Further, the sheet resistance as a cathode is preferably not more than a few hundreds Ω/□ and the layer thickness is generally selected in a range of 10 nm-1 µm and preferably of 10-200 nm. Herein, to transmit emission, either one of an anode or a cathode of an organic EL element is preferably transparent or translucent to improve the emission luminance.

<<Substrates>>

It is preferable that the organic EL element of the present invention is formed on a substrate (hereinafter also referred to as a base plate, a base, a support, or a film).

Types of substrates which are usable in the organic EL element of the present invention are not limited to glass and plastic as long as they are transparent. Examples of preferably employable substrates include glass, quartz, and transparent films. Particularly preferable substrates include transparent film capable of resulting in flexibility of the organic EL element.

In practice, it is possible to employ polyolefin (PO) resins such as homopolymers or copolymers of ethylene, polypropylene, and butane; amorphous polyolefin resins (APO) such as cyclic polyolefins; polyester based resins such as polyethylene terephthalate (PET), or polyethylene2,6-naphthalate; polyamide based (PA) resins such as nylon 6, nylon 12, or copolymerized nylon; polyvinyl alcohol (PVA) based resins such as polyvinyl alcohol resins or ethylene-vinyl alcohol copolymers (EVOH); polyimide (PI) resins, polyether imide (PEI) resins, polysulfone (PS) resins, polyether sulfone (PES) resins, polyether ether ketone (PEEK) resins, polycarbonate (PC) resins, polyvinyl butyrate (PVB) resins, polyacrylate (PAR) resins, and fluorine based resins such as ethylene-tetrafluoroethylene copolymers (ETFE), trifluorochloroethylene (PFE), tetrafluoroethylene-perfluoroalkyl vinyl ether copolymers, vinylidene fluoride (PVDF), vinyl fluoride (PVF), or perfluoroethylene-perfluoropropylene-perfluorovinyl ether copolymers.

Further, other than the above listed resins, it is possible to employ photocurable resins such as resin compositions composed of acrylate compounds incorporating radically reactive unsaturated compounds, resin compositions composed of the above acrylate compounds and mercapto compounds having a thiol group, or resin compositions prepared by dissolving, in polyfunctional acrylate monomers, oligomers such as epoxy acrylate, urethane acrylate, polyester acrylate, or polyether acrylate, as well as mixtures thereof. Further, it is possible to employ as a substrate film, those which are prepared by laminating one or at least two types of these resins via means such as lamination or coating.

It is possible to employ the above components individually or upon being appropriately mixed. Of these, it is preferable to employ commercial products such as ZEONEX or ZEONOA (produced by Nihon Zeon Co., Ltd.), amorphous cyclopolyolefin resin film, ARTON (produced by JSR Co., Ltd.), polycarbonate film, PURE ACE (produced by Teijin Ltd.), or cellulose triacetate film, KONICA TAC KC4UX or KV8UX (produced by Konica Minolta Opto, Inc.).

Further, the substrates according to the present invention, which employ the above listed resins may be either oriented or non-oriented films.

It is possible to produce the substrate according to the present invention via common methods known in the prior art. For example, it is possible to produce a non-stretched substrate which is substantially amorphous and is not oriented in such a manner that resins as a raw material are melted in an extruder and extruded employing a ring die or a T die followed by rapid cooling. Further, it is possible to produce a stretched substrate in such a manner that a non-stretched substrate is stretched in the substrate flowing (vertical axis) direction or at a right angle (horizontal axis) to the substrate flowing direction employing methods known in the art such as uniaxial stretching, tenter system sequential biaxial stretching, tenter system simultaneous biaxial stretching, or tubular system simultaneous biaxial stretching. In the above cases, it is possible to appropriately choose the stretching factor depending on the resins employed as the raw materials for the substrates. However, a factor of 2-10 is preferred for each of both vertical and horizontal axes.

Further, prior to forming a deposition film, it may be applied, to the substrate according to the present invention, a surface treatment such as a corona treatment, a flame treatment, a plasma treatment, a glow discharge treatment, a surface roughening treatment, or a chemical treatment.

Still further, to enhance close adherence to the deposited film, an anchor coating agent layer may be formed on the surface of the substrate according to the present invention. Anchor coating agents which are employed in the above anchor agent coating layer include polyester resins, isocyanate resins, urethane resins, acryl resins, ethylene vinyl alcohol resins, vinyl-modified resins, epoxy resins, modified styrene resins, modified silicone resins, and alkyl titanate. These may be employed individually or in combinations of at least two types. It is possible to add conventional additives known in the art to the above anchor coating agents. The above anchor coating agents are applied onto a substrate employing the methods known in the art such as roller coating, gravure coating, knife coating, dip coating, or spray coating followed by removal of solvents and diluting agents via drying, whereby anchor coating is achieved. The coated amount of the above anchor coating agents is regulated to be about 0.1 to about 5 g/m$^2$ (in the dried state).

As the substrate, a long-length product which is wound in a roll shape is convenient. It is not possible to specify the thickness of the substrate since it differs depending on use. When a film is employed for packaging, its thickness is not particularly limited. Based on the suitability as a packaging material, the thickness is preferably in the range of 3-400 µm, but is more preferably in the range of 50-100 µm.

Further, when the substrate employed in the present invention is in a film shape, its thickness is preferably 10-200 µm, but is more preferably 50-100 µm.

<<Display Device>>

The organic EL element of the present invention may be employed as one type of lamp such as a light source for lighting and exposure, or as a display device (hereinafter also referred to simply as a display) of such a type by which still images and moving images are directly viewed. When employed as a display device to reproduce moving images, its driving system may be either a simple matrix (passive matrix) system or an active matrix system. By employing at least two types of the organic EL elements which result in different colors of emitted light, it is possible to produce a full-color display device.

<<Light Taking-Out Technology>>

In order to enhance the taking-out efficiency of light emitted from the light emitting layer, the surface of the substrate may be treated to result in a prism or lens-like shape, or may be adhered with a prism sheet or a lens sheet.

The organic EL element of the present invention may exhibit a low refractive index layer between the electrode and the substrate. The low refractive index layer includes layers composed, for example, of aerogel, porous silica, magnesium fluoride, or fluorine based polymers.

The refractive index of substrates is commonly about 1.5-about 1.7. Accordingly, the refractive index of the above low refractive index layer is preferably at most about 1.5, but is more preferably at most 1.35. Further, the thickness of the low refractive index medium is preferably at least two times the wavelength in the medium, for which is that when the thickness of a low refractive index medium reaches a value near the wavelength of light so that electromagnetic waves oozed via evanescent enter into the substrate, effects of the low refractive layer are degraded.

The organic EL element of the present invention may have a diffraction grating between any of the layers or in the media (in the transparent substrate or the transparent electrode). It is preferable that an introduced diffraction grating has a two-dimensional cyclic refractive index. Since light from a light emitting layer is randomly generated in all directions, light directed in a specific direction is only diffracted by a common one-dimensional diffraction grating having a cyclic refractive index distribution only in a certain direction, whereby light taking-out efficiency is not so enhanced. However, by altering the refractive index distribution to a two-dimensional distribution, light directed in all directions is diffracted, whereby the light taking-out efficiency is enhanced. As noted above, the location at which the diffraction grating is introduced may be between any of the layers or in the medium (in the transparent substrate and in the transparent electrode), while the location near the organic light emitting layer in which light is generated is preferable. In this case, it is preferable that the period of the diffraction grating is about ½-about 3 times the wavelength of light in the media. It is preferable that diffraction gratings are two-dimensionally and repeatedly arranged to form a square lattice, a triangle lattice, or a honeycomb lattice.

It is preferable that the substrate according to the present invention has a gas barrier layer, whereby dark spots are effectively minimized and storage stability at high temperature and high humidity is also significantly improved.

<<Gas Barrier Layers>>

Composition of the gas barrier layer according to the present invention is not particularly limited as long as it prevents permeation of oxygen and water vapor. Oxygen permeability is preferably at most 0.05 ml/m$^2$·day·MPa at 23° C. and 0% relative humidity, while water vapor permeability determined by the JIS K7129 B Method is preferably at most 0.1 g/m$^2$·day. Materials which constitute the gas barrier layer according to the present invention are preferably inorganic oxides, and specific examples thereof may include silicon oxide, aluminum oxide, silicon oxide nitride, aluminum oxide nitride, magnesium oxide, zinc oxide, indium oxide, and tin oxide.

Further, the thickness of the gas barrier layer in the present invention is appropriately selected, since optimal conditions differ depending on the type and constitution of employed materials, but is preferably within the range of 5-2,000 nm. When the thickness of the gas barrier layer is at most the above lower limit, it becomes difficult to prepare a targeted gas barrier layer. When the thickness of the gas barrier layer is at least the above upper limit, it is difficult to allow a gas barring layer to maintain the required flexibility, and the gas barring film may suffer from cracking due to external factors such as bending, folding, or pulling after film-production.

It is possible to form the gas barrier layer according to the present invention by applying the raw materials described below via a spray method, a spin coating method, a sputtering method, an ion assist method, the plasma CVD method described below, the plasma CVD method at atmospheric pressure or near atmospheric pressure described below.

FIG. 1 is one example showing the constitution of a substrate having the gas barrier layer according to the present invention.

The constitution of the substrate incorporating the gas barrier layer according to the present invention and its density will now be described.

The substrate incorporating the gas barrier layer according to the present invention is constituted in such a manner that a multilayer in which each layer has different density is formed on substrate 22, and a constitution is realized in which closely adhered film 23, ceramic film 24 and protective film 25 are multilayered. FIG. 1 shows an example in which three layers are multilayered. Density distribution in each of the layers is regulated to be uniform and the density of the ceramic film is regulated to be higher than that of each of the closely adhered film and the protective film which is located over and under the above ceramic film. In FIG. 1, each layer is composed of one layer, but if desired, may be composed of at least two layers.

It is possible to form a closely adhered film, the ceramic film and the protective film onto a substrate by employing a spray method, a spin coating method, a sputtering method, an ion assist method, a plasma CVD method, or a plasma CVD method at atmospheric pressure or near atmospheric pressure described below.

EXAMPLES

The present invention will now be detailed with reference to examples, however the present invention is not limited thereto.

Example 1

Preparation of Organic EL Element 1-1

Substrate 1 incorporating a gas barrier layer under the profile structure described in FIG. 1 was prepared on a 100 μm thick polyethylene terephthalate film (produced by Teijin DuPont Films Japan Ltd., hereinafter abbreviated as PEN) (Substrate 1) employing an atmospheric plasma discharging apparatus and the discharging conditions, described below.
(Atmospheric Plasma Discharging Apparatus)

Figure 2:
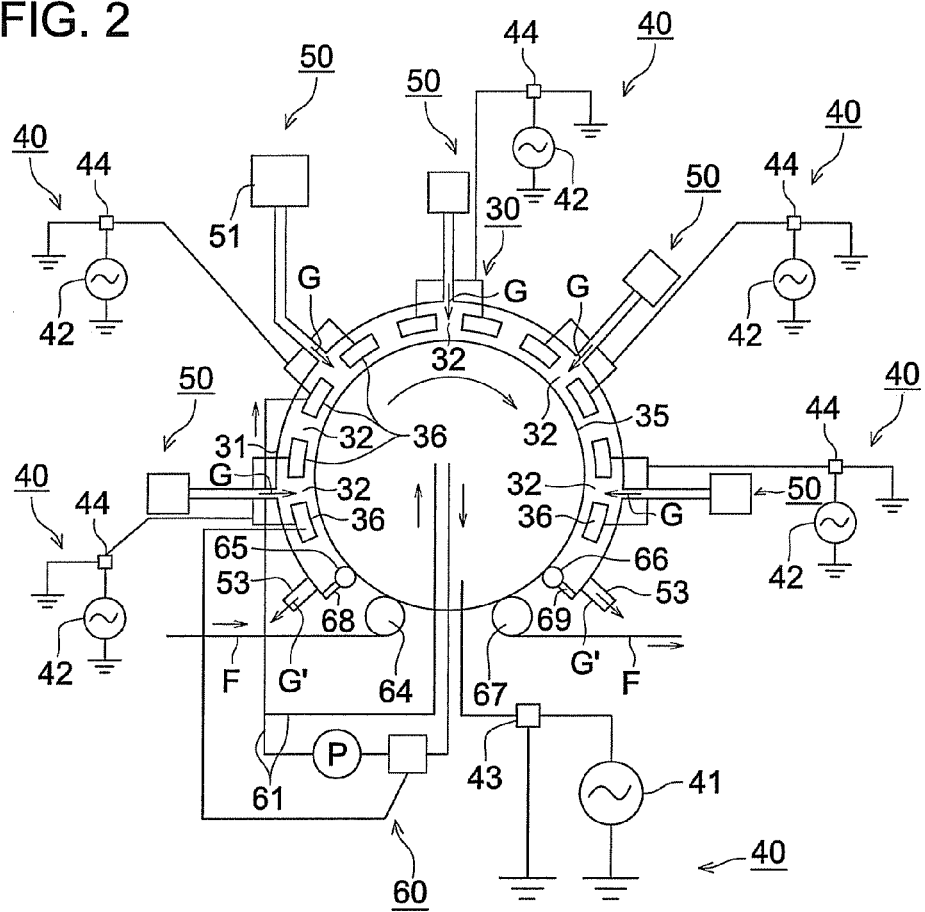
FIG. 2 is a schematic view showing one example of an atmospheric pressure plasma discharge treatment apparatus employing the system in which a substrate is treated between counter electrodes, which is useful in the present invention.

By employing the atmospheric plasma discharging apparatus of FIG. 2, prepared were a roller type electrode covered with dielectric materials and a plurality of square cylindrical electrode sets, as described below.

With regard to the roller electrode which functions as a first electrode, a jacket roller metal host material composed of titanium alloy T64 having a cooling means via cooled water was covered with a high density and high adhesion alumina sprayed film employing an atmospheric pressure plasma method so that the roller diameter reached 1,000 mmφ. On the other hand, with regard to the square cylindrical electrode as a second electrode, a hollow square cylindrical type titanium alloy T64 was covered with 1 mm of the same dielectric materials as above under the same conditions as above, whereby a group of facing square cylindrical type fixed electrodes was prepared.

Arranged around the roller rotating electrode were 10 above square cylindrical type electrodes so that the distance between facing electrodes reached 1 mm. The total discharging area of the group of square cylindrical fixed electrodes was 150 cm (length in the lateral direction)×4 cm (length in the conveying direction)×10 (the number of electrodes)=6,000 cm². In any case, appropriate filters were arranged.

During plasma discharge, the first electrode (the roller rotating electrode) was heated and maintained at 120° C., while the second electrode (the group of square cylindrical type fixed electrode) was heated and maintained at 80° C. The rotating roller electrode was rotated via a drive and a thin film was formed. Of the above 10 square cylindrical electrodes, two upstream electrodes were employed for film making of the following first layer (the closely adhered layer), the 6 following electrodes were employed for film production of the following second layer (the ceramic layer), and the two remaining electrodes were employed for film production of the following third layer (the protective layer). Each of the conditions was set and three layers were laminated in one operation.
(First Layer: Closely Adhered Layer)

A plasma discharge was carried out under the following conditions, whereby a 50 nm thick closely adhered layer was formed.
<Gas Conditions>

| | |
|---|---|
| Discharge gas: nitrogen gas | 94.5% by volume |
| Thin film forming gas: hexamethyldicyclohexane (gasified while mixed with nitrogen gas, by the gas flow controller, produced by Lintec Corp.) | 0.5% by volume |
| Added gas: oxygen gas | 5.0% by volume |

<Power Source Conditions: Only the Power Source on the First Power Source Side was Employed>
    First power source
        Power source type: High frequency power source produced by Oyo Electric Co., Ltd.
        Frequency: 80 kHz
        Power density: 10 W/cm²

The density of the first layer (the closely adhered layer) formed as above was measured by above MXP21 produced by Macscience Co.), based on the X-ray reflectance method, resulting in a value of 1.90.
(Second Layer: Ceramic Layer)

An about 30 nm thick ceramic layer was formed via plasma discharge under the following conditions.
<Gas Conditions>

| | |
|---|---|
| Discharge gas: nitrogen gas | 94.9% by volume |
| Thin film forming gas: hexamethyldisiloxane (gasified while mixed with nitrogen gas, by the gas flow controller, produced by Lintec Corp.) | 0.1% by volume |
| Added gas: oxygen gas | 5.0% by volume |

<Power Source Conditions>
    First electrode side: power source type: high frequency wave power source produced by Oyo Electric Co., Ltd.
        Frequency: 80 kHz
        Power density: 10 W/cm²
    Second electrode side: power source type: high frequency wave power source produced by Pearl Industry Co., Ltd.
        Frequency: 13.56 MHz
        Power density: 10 W/cm²

The density of the second layer (the ceramic layer) layer formed as above was measured by above MXP21, produced by Macscience Co., based on the X-ray reflectance method, resulting in a value of 2.20.

(Third Layer: Protective Layer)

An about 200 nm thick protective layer was formed via plasma discharge under the following conditions.

<Gas Conditions>

| Discharge gas: nitrogen gas | 93.0% by volume |
|---|---|
| Thin film forming gas: hexamethyldisiloxane (gasified while mixed with nitrogen gas, by the gas flow controller, produced by Lintec Corp.) | 2.0% by volume |
| Added gas: oxygen gas | 5.0% by volume |

<Power Source Conditions: the Source on the First Electrode Side was Employed>

First electrode side: power source type: high frequency wave power source produced by Oyo Electric Co., Ltd.
Frequency: 80 kHz
Power density: 10 W/cm$^2$ The density of the third layer (the protective layer) formed as above was measured by above MXP21, produced by Macscience Co., based on the X-ray reflectance method, resulting in a value of 1.95.

The water vapor permeability was determined by the method based on JIS K 7129B, resulting in at most 10–3 g/m$^2$/day. The oxygen permeability was determined by the method based on JIS K 7126B, resulting in at most $10^{-3}$ g/m$^2$/day.

Subsequently, a 120 nm thick ITO (indium tin oxide) film was formed on substrate 1, and the resulting substrate was subjected to patterning. Thereafter, the resulting substrate having thereon an ITO transparent electrode was subjected to ultrasonic wave cleaning employing isopropyl alcohol, dried employing dehumidified nitrogen gas, and subjected to UV ozone cleaning for 5 minutes. The resulting substrate was fixed in the substrate holder of a commercial vacuum deposition apparatus, and the pressure was lowered to 4×10$^{-4}$ Pa, whereby ITO substrate 100 was prepared.

Figure 3:
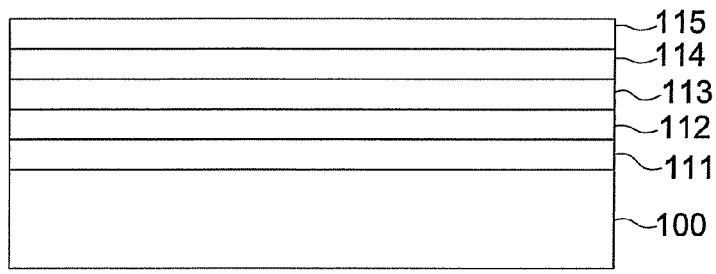
FIG. 3 is a view showing a discharge and film-making process of Organic EL Element 1-1.

Subsequently, as shown in FIG. 3, fluid D1 incorporating the following polymer of Exemplified Compound A7 and THF was discharged onto ITO substrate 100, employing commercial ink-jet system head 10 (KM512S, produced by Konica Minolta, Inc.) and 50 nm thick positive hole transporting layer 111 was formed over 60 minutes at 100° C.

Subsequently, fluid D2 incorporating the following polymer of Exemplified Compound A15 and Phosphorescent Compound 1-1 (at a weight ratio of 100:5) as a host, as well as THF were discharged onto positive hole transporting layer 111, and 50 nm thick light emitting layer 112 was formed over 60 minutes at 100° C.

Subsequently, fluid D3 incorporating the following polymer of Exemplified Compound A28 and ethyl acetate was discharged onto light emitting layer 112, employing ink-jet head system head 10, whereby 50 nm thick electron transporting layer 113 was formed. Thereafter, 200 nm thick aluminum cathode 114 was deposited onto above electron transporting layer 113.

Further, the organic solvent content ratio of each of positive hole transporting layer 111, light emitting layer 112, and electron transporting layer 113 was regulated as listed in Table 1. Still further, gas barrier layer 115 (substrate 1 incorporating a gas barrier layer) was adhered thereon, whereby Organic EL Element 1-1 was prepared.

(Synthesis of Polymer of Exemplified Compound A15)

In a reaction vessel were placed 1.34 g (2.5 mmol) of Exemplified Compound A15, 0.010 g (0.061 mmol) of 2,2'-azobis(isobutyronitrile) (AIBN), and 30 ml of butyl acetate. After achieving nitrogen replacement, the resultant underwent reaction at 80° C. for 10 hours. After the above reaction, acetone was charged and re-precipitation was conducted, whereby a polymer was obtained via filtration. Purification was conducted twice via re-precipitation by charging a recovered polymer chloroform solution into methanol. After recovery, vacuum drying was carried out, whereby 1.20 g the targeted polymer of Exemplified Compound A4 as a powder was prepared. The weight average molecular weight of the resulting copolymer was 10,000 in terms of polystyrene (determined by GPC measurement employing HFIP (hexafluoroisopropanol) as an eluent).

The Polymer (at an average molecular weight of 36,000) of Exemplified Compound A7 and the polymer (at an average molecular weight of 26,000) of Exemplified Compound A28 were synthesized employing the method above.

<Preparation of Organic EL Elements 1-2 Through 1-12>

Each of Organic EL Elements 1-2 through 1-12 was prepared in the same manner as Organic EL Element 1-1, except that layer constituents were replaced with those listed in Table 1 below.

<Preparation of Organic EL Elements 1-13 and 1-14>

Exemplified Compound A47 was vapor-deposited onto a glass substrate having a transparent indium oxide electrode (an ITO electrode) at a film thickness of 50 nm to form a positive hole transporting layer, employing a conventional method. Thereafter, Exemplified Compound A31 and Phosphorescent Compound 1-60 (at a weight ratio of 100:5) were vapor-deposited at a film thickness of 50 nm to form an electron transporting layer, subsequently, Exemplified Compound A34 was vapor-deposited at a film thickness of 50 nm to form an electron transporting layer, and further, Al was vapor-deposited at a film thickness of 200 nm, whereby a cathode was formed. Further, substrate 1 having a gas barrier layer was adhered, whereby Organic EL Elements 1-13 and 1-14 were prepared.

<Preparation of Organic EL Element 1-15>

Organic EL element 1-15 was prepared in the same manner as Organic EL element 1-1, except that materials of each layer were replaced with those listed in Table 1, and the substrate was replaced with a glass substrate having a transparent indium tin oxide electrode (an ITO electrode).

<Preparation of Organic EL Elements 1-16 and 1-17>

Each of Organic EL Elements 1-16 and 1-17 was prepared in the same manner as Organic EL Element 1-1, except that constituents of each layer were replaced with the constituents listed in Table 1 below.

Organic EL Element 1-18 was prepared in the same manner as Organic EL Element 1-1, except that THF was replaced with xylene and the constituents of each layer were replaced with the constituents listed in Table 1 below.

<Preparation of Organic EL Element 1-19>

Organic EL Element 1-19 was prepared in the same manner as Organic EL Element 1-1, except that substrate 1 was adhered onto aluminum 114 (a cathode).

Table 1 shows the film density of each light emitting layer and the organic solvent content of each organic layer. The listed values were determined via the above methods.

TABLE 1

| Organic EL Element | ositive Hole Transporting Layer (50 nm) | Light Emitting Layer (50 nm) Host | Molecular Weight | Dopant (5% by weight) | Electron Transporting Layer (50 nm) | Film Density (Light Emitting Layer) g/cm³ | Organic Solvent Content of Organic Layer (ppm) | Remarks |
|---|---|---|---|---|---|---|---|---|
| 1-1 | A7 | A15 | 10000 | 1-1 | A28 | 1.13 | 12 | Inv. |
| 1-2 | A7 | A15 | 10000 | 1-2 | A27 | 1.15 | 20 | Inv. |
| 1-3 | A16 | A15 | 10000 | 1-31 | A28 | 1.13 | 15 | Inv. |
| 1-4 | A38 | A43 | 512.6 | 1-2 | A32 | 1.23 | 11 | Inv. |
| 1-5 | A37 | A40 | 408.5 | 1-17 | A30 | 1.22 | 15 | Inv. |
| 1-6 | A36 | A46 | 498.6 | 1-20 | A35 | 1.23 | 18 | Inv. |
| 1-7 | A37 | A47 | 498.6 | 1-32 | A32 | 1.21 | 10 | Inv. |
| 1-8 | A38 | A40 | 408.5 | 1-14 | A32 | 1.22 | 15 | Inv. |
| 1-9 | A37 | A46 | 498.6 | 1-60 | A35 | 1.23 | 68 | Inv. |
| 1-10 | A36 | A47 | 498.6 | 1-72 | A30 | 1.21 | 10 | Inv. |
| 1-11 | A36 | A31 | 484.6 | Ir-12 | A35 | 1.22 | 130 | Comp. |
| 1-12 | A37 | A31 | 484.6 | 1-60 | A34 | 1.22 | 120 | Inv. |
| 1-13 | A37 | A31 | 484.6 | 1-60 | A34 | 1.3 | 1500 | Comp. |
| 1-14 | A37 | A31 | 484.6 | 1-60 | A34 | 1.3 | 0.003 | Comp. |
| 1-15 | A37 | A31 | 484.6 | 1-60 | A34 | 1.22 | 22 | Inv. |
| 1-16 | A36 | A49 | 395 | 1-14 | A32 | 1.22 | 40 | Inv. |
| 1-17 | A36 | A10 | 1100000 | 1-14 | A32 | 1.12 | 170 | Inv. |
| 1-18 | A37 | A10 | 30000 | 1-60 | A34 | 1.07 | 500 | Comp. |
| 1-19 | A37 | A31 | 484.6 | 1-60 | A34 | 1.2 | 30 | Inv. |

Inv.: Present Invention,
Comp.: Comparatives Example

<Evaluation of Organic EL Elements>
Prepared organic EL elements were evaluated as described below. Table 2 shows the results.
(Emitted Light Luminance)
Emitted light luminance (cd/m²) of organic EL elements was measured at 23° C. under application of 10 V direct current voltage. The emitted light luminance was represented by a relative value, when the value of Organic EL Element 1-11 was assigned 100. The emitted light luminance was determined via CS-1000 (produced by Konica Minolta Sensing, Inc.).
(Dark Spots)
After driving for 30 hours under application of a constant electric current of 15 mA/cm², the number of visually confirmed non-light emitting points (dark spots) was determined.
(Voltage Increase Ratio)
When driven at a constant electric current of 10 mA/cm², initial voltage and voltage after 150 hours were determined. The relative value of the voltage after 100 hours with respect to the initial voltage was designated as the voltage increase ratio.
(Storage Stability)
After storing an organic EL element at 60° C. and 70% relative humidity for one month, emitted light luminance (cd/m²) was determined. Storage stability was represented by a relative value with respect to the determined value of the emitted light luminance prior to storage.

TABLE 2

| Organic EL Element | Emitted Light Luminance | Voltage Increase Ratio | Storage Stability | Number of Dark Spots | Remarks |
|---|---|---|---|---|---|
| 1-1 | 118 | 111 | 95 | 11 | Present Invention |
| 1-2 | 119 | 111 | 95 | 11 | Present Invention |
| 1-3 | 117 | 112 | 94 | 12 | Present Invention |
| 1-4 | 116 | 112 | 94 | 14 | Present Invention |
| 1-5 | 114 | 112 | 94 | 15 | Present Invention |
| 1-6 | 114 | 112 | 93 | 14 | Present Invention |
| 1-7 | 115 | 112 | 94 | 14 | Present Invention |
| 1-8 | 107 | 116 | 91 | 18 | Present Invention |
| 1-9 | 110 | 115 | 92 | 16 | Present Invention |
| 1-10 | 109 | 115 | 91 | 16 | Present Invention |
| 1-11 | 100 | 123 | 86 | 28 | Comparative Example |
| 1-12 | 108 | 118 | 89 | 20 | Present Invention |
| 1-13 | 98 | 129 | 82 | 35 | Comparative Example |
| 1-14 | 100 | 129 | 81 | 40 | Comparative Example |
| 1-15 | 106 | 117 | 88 | 20 | Present Invention |
| 1-16 | 106 | 119 | 88 | 22 | Present Invention |
| 1-17 | 106 | 120 | 88 | 22 | Present Invention |
| 1-18 | 98 | 130 | 81 | 36 | Comparative Example |
| 1-19 | 105 | 122 | 87 | 23 | Present Invention |

As can clearly be seen from Table 2, with regard to the organic EL elements of the present invention, dark spots and rise in the voltage significantly decreased, and the storage stability and the emitted light luminance were enhanced. Further, when the substrate having the gas barrier layer was employed, improved effects were marked compared to the glass substrate.

Example 2

Figure 4:
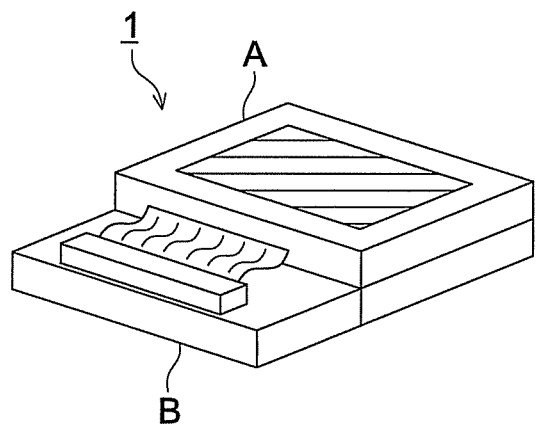
FIG. 4 is a view showing an active matrix system full-color display device.
Figure 5:
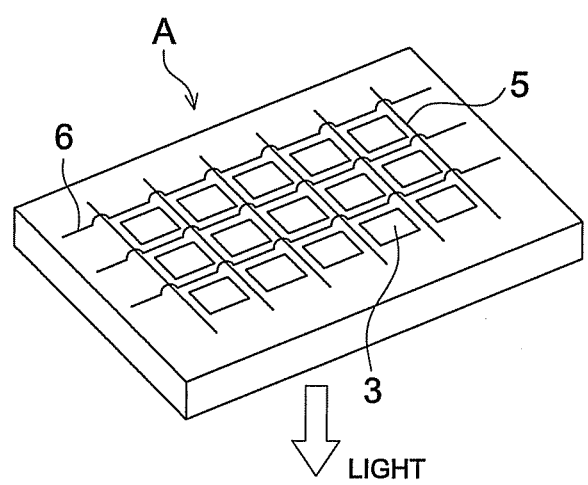
FIG. 5 is a schematic view of display section A of the full-color display device.

Organic EL Element 1-1 prepared in Example 1, a green light emitting organic EL element which was prepared in the same manner as Example 1, except that the phosphorescing compound of Organic EL Element 1-1 of the present invention was replaced with Ir-1, and a red light emitting organic EL element which was prepared in the same manner as Example 1, except that the phosphorescing compound of Organic EL Element 1-1 of the present invention was replaced with Ir-9, were aligned on a single substrate, whereby an active matrix system full-color display device shown in FIG. 4 was prepared. In FIG. 5, only shown is a schematic view of display section A of the prepared full-color display device. Namely, on a single substrate, placed were a wiring section incorporating a plurality of scanning lines 5 and data lines 6, and a plurality of aligned pixels 3 (pixels of emitted light in the red region, the green region, and the blue region). Each of scanning lines 5 and a plurality of data lines 6 was composed of electrically conductive materials. Scanning lines 5 and data lines 6 were mutually orthogonal in a lattice shape and connect pixels 3 at the orthogonal position (not detailed). The above plurality of pixels 3 were driven via an active matrix system provided with each of the organic EL elements corresponding to each emitted light color, switching transistors which were active elements, and driving transistors. When scanning signals were applied from scanning lines 5, image signals were received from data lines 6 and light was emitted depending on the received image data. By appropriately aligning each of the red, green, and blue pixels, it become possible to achieve a full-color display.

By driving a full-color display device, clear full-color moving image display was achieved.

Example 3

<<Preparation of Lighting Device>>

A lighting device was prepared in such a manner that a glass case was provided which was subjected to reflection coating on the non-light emitting side of each of the blue light, green light, and red light emitting organic EL elements prepared in Example 2.

Example 4

<<Preparation of Organic EL Element 4-1>>

Organic EL Element 4-1 was prepared which was composed of the constituent and resulted in the thickness listed in Table 3, under the same conditions as those employed to prepare Organic EL Element 1-1 of Example 1.

TABLE 3

| Organic EL Element No. | Organic Layer | Constituent | Film Thickness (nm) |
|---|---|---|---|
| 4-1 | Positive Hole Injecting Layer | A39 | 40 |
| | Positive Hole Transporting Layer | A36 | 10 |
| | Light Emitting Layer 1 | A43 (97% by weight) 1-1 (3% by weight) | 15 |
| | Interlayer 1 | A40 | 5 |
| | Light Emitting Layer 2 | A43 (92% by weight) Ir-9 (8% by weight) | 10 |

TABLE 3-continued

| Organic EL Element No. | Organic Layer | Constituent | Film Thickness (nm) |
|---|---|---|---|
| | Interlayer 2 | A43 | 5 |
| | Light Emitting Layer 3 | A43 (95% by weight) Ir-1 (5% by weight) | 5 |
| | Positive Hole Blocking Layer | A33 | 10 |
| | Electron Transporting Layer | A35 | 50 |

The film density of light emitting layer 1 was 1.24 g/cm³. Further, drying conditions were regulated so that the solvent content of the organic layer reached 10 ppm.

Subsequently, 200 nm thick aluminum was subjected to vapor deposition thereon.

When sealed, substrate 1, carrying a gas barrier layer was adhered in the same manner as Organic EL Element 1. A lighting device was prepared in the same manner as Example 3 in that a glass case was provided which was subjected to reflection coating on the non-light emitting side. It was possible to employ the prepared lighting device as a thin white light emitting type one which exhibited a high light emitting efficiency, and a long light emitting life.

Subsequently, the color reproduction regions were evaluated when commercial color filters for a display use were combined. When Organic EL Element 4-1 was combined with color filters, it was confirmed that the color reproduction region was more extended and color reproduction performance was rated as excellent.

The invention claimed is:

1. An organic electroluminescent element comprising a substrate having thereon an electrode and one or more organic layers, wherein one of the organic layers is a light emitting layer which incorporates a phosphorescent compound represented by Formula (1) and a host compound, and the light emitting layer has a film surface density of 1.10-1.25 g/cm³:

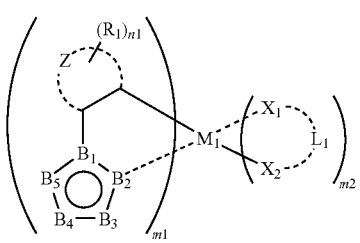

Formula (1)

wherein $R_1$ represents a substituent; Z represents a group of non-metallic atoms necessary to form a 5- to 7-membered ring; n1 represents an integer of 0 -5; $B_1$-$B_5$ each represents the following set (i) or set (ii):

set (i) B1 and B3 are a nitrogen atom, and B2, B4, and B5 are a carbon atom, set (ii) B2 and B5 are a nitrogen atom, and B1, B3, and B4 are a carbon atom;

$M_1$ represents a metal in Groups 8-10 of a periodic table; $X_1$ and $X_2$ each represents a carbon atom, a nitrogen atom, or an oxygen atom; L1 represents a group of atoms which forms a bidentate ligand together with $X_1$ and $X_2$;

m1 represents an integer of 1-3; and m2 represents an integer of 0-2, provided that a sum of m1 and m2 is an integer of 2 or 3.

2. The organic electroluminescent element of claim 1, wherein one of the organic layers has a film surface density of 1.20-1.25 g/cm$^3$.

3. The organic electroluminescent element of claim 1, wherein the host compound has a molecular weight of 400-2,000.

4. The organic electroluminescent element of claim 1, wherein one of the organic layers has a film surface density of 1.10-1.15 g/cm$^3$.

5. The organic electroluminescent element of claim 1, wherein the host compound has a weight average molecular weight of 5,000-1,000,000.

6. The organic electroluminescent element of claim 1, wherein the substrate is provided with a gas barrier layer.

7. The organic electroluminescent element of claim 1, wherein at least one of the organic layers emits a blue light.

8. The organic electroluminescent element of claim 1, wherein the organic electroluminescent element is configured to emit a white light.

9. A display device comprising the electroluminescent element of claim 1.

10. A lighting device comprising the electroluminescent element of claim 1.

11. A display device comprising the lighting device of claim 10 and a liquid crystal element as a display means.

* * * * *